(12) United States Patent     (10) Patent No.:   US 12,568,793 B2
Kang              (45) Date of Patent:     Mar. 3, 2026

(54) SUBSTRATE PROCESSING APPARATUS, SUBSTRATE PROCESSING METHOD, AND STORAGE MEDIUM THEREOF

(71) Applicant: Tokyo Electron Limited, Tokyo (JP)

(72) Inventor: Youngtai Kang, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 366 days.

(21) Appl. No.: 18/243,063

(22) Filed: Sep. 6, 2023

(65) Prior Publication Data

US 2024/0087926 A1     Mar. 14, 2024

(30) Foreign Application Priority Data

Sep. 12, 2022    (JP) ................................. 2022-144789

(51) Int. Cl.
| | |
|---|---|
| *H01L 21/67* | (2006.01) |
| *H01L 21/66* | (2006.01) |
| *H01L 21/68* | (2006.01) |
| *H01L 21/687* | (2006.01) |

(52) U.S. Cl.
CPC .. H01L 21/67259 (2013.01); H01L 21/68707 (2013.01); H01L 22/12 (2013.01)

(58) Field of Classification Search
CPC ............... H01L 21/67259; H01L 21/68; H01L 21/68707; H01L 22/12
See application file for complete search history.

(56) References Cited

U.S. PATENT DOCUMENTS

| | | | |
|---|---|---|---|
| 2004/0159284 A1* | 8/2004 | Sakamoto | ......... H01L 21/67259 |
| | | | 118/712 |
| 2015/0017880 A1* | 1/2015 | Nomura | .................. H01L 22/26 |
| | | | 451/6 |
| 2016/0211157 A1* | 7/2016 | Inoshima | .......... H01L 21/68757 |
| 2021/0020487 A1* | 1/2021 | Kang | ................ H01L 21/67303 |

FOREIGN PATENT DOCUMENTS

JP     2012-094814 A     5/2012

\* cited by examiner

*Primary Examiner* — Mark A Connolly
(74) *Attorney, Agent, or Firm* — Venjuris, P.C.

(57) ABSTRACT

A substrate processing apparatus includes: a substrate transfer controller that determines a placement condition of the substrate holder and a substrate placement position on the substrate holder based on a model, a substrate transfer position setting value, and a substrate holder setting value from the film thickness measurement result, and operates the substrate transfer device; an eccentricity status analysis unit that analyzes an eccentric state from a film thickness variation state; a learning function unit that updates the model based on the eccentric state; and an optimization function unit that updates the placement condition of the substrate holder and the substrate placement position on the substrate holder based on the updated model, the substrate transfer position setting value, and the substrate holder setting value.

10 Claims, 20 Drawing Sheets

*FIG. 5B*

SETTING OF TRANSFER DEVICE

FORWARD/
BACKWARD =FB

33

ROTATION =RT

MONITOR
WAFER
M1～M7

GAS

| MEASUREMENT POINT NUMBER | FILM THICKNESS OF MONITOR WAFER M1 [Å] | FILM THICKNESS OF MONITOR WAFER M2 [Å] | FILM THICKNESS OF MONITOR WAFER M3 [Å] | FILM THICKNESS OF MONITOR WAFER M4 [Å] | FILM THICKNESS OF MONITOR WAFER M5 [Å] |
|---|---|---|---|---|---|
| 1 | FILM THICKNESS VALUE M1_1 | FILM THICKNESS VALUE M2_1 | FILM THICKNESS VALUE M3_1 | FILM THICKNESS VALUE M4_1 | FILM THICKNESS VALUE M5_1 |
| ・・ | ・・ | ・・ | ・・ | ・・ | ・・ |
| 24 | FILM THICKNESS VALUE M1_24 | FILM THICKNESS VALUE M2_24 | FILM THICKNESS VALUE M3_24 | FILM THICKNESS VALUE M4_24 | FILM THICKNESS VALUE M5_24 |

*FIG. 13*

| TP | TOP RT[° ] | TOP FB[mm] | : | BTM RT[° ] | BTM FB[mm] |
|---|---|---|---|---|---|
| CURRENT RUN | TP VALUE TOPRT | TP VALUE TOPFB | : | TP VALUE BTMRT | TP VALUE BTMFB |

*FIG. 14*

| TP | TOP MAX RT [°] | TOP MIN RT [°] | TOP MAX FB [mm] | TOP MIN FB [mm] | : | BTM MAX RT [°] | BTM MIN RT [°] | BTM MAX FB [mm] | BTM MIN FB [mm] |
|---|---|---|---|---|---|---|---|---|---|
| ADJUSTABLE RANGE | TP VALUE MAXRT | TP VALUE MINRT | TP VALUE MAXFB | TP VALUE MINFB | : | TP VALUE MAXRT | TP VALUE MINRT | TP VALUE MAXFB | TP VALUE MINFB |

FIG. 16

DIFFERENCE FROM AVERAGE FOR RUN

|  | DIFFERENCE FROM AVERAGE |
|---|---|
| POINT 1 | $\alpha 1$ |
| POINT 2 | $\alpha 2$ |
| . | . |
| . | . |
| POINT n | $\alpha n$ |

FIG. 17

CONSTRAINT CONDITION

|  | RT VALUE 1 | FB VALUE 1 | $\cdots$ | RT VALUE m | FB VALUE m |
|---|---|---|---|---|---|
| PLUS MOVEMENT AMOUNT (MAXIMUM) | MAXRT1 | MAXFB1 | $\cdots$ | MAXRTm | MAXFBm |
| MINUS MOVEMENT AMOUNT (MAXIMUM) | MINRT1 | MINFB1 | $\cdots$ | MINRTm | MINFBm |

SUBSTRATE PROCESSING APPARATUS, SUBSTRATE PROCESSING METHOD, AND STORAGE MEDIUM THEREOF

CROSS-REFERENCE TO RELATED APPLICATIONS

The present application is based on and claims priority from Japanese Patent Application No. 2022-144789, filed on Sep. 12, 2022, with the Japan Patent Office, the disclosure of which is incorporated herein in its entirety by reference.

TECHNICAL FIELD

The present disclosure relates to a substrate processing apparatus, a substrate processing method, and a storage medium that stores a program.

BACKGROUND

In the manufacturing process of semiconductor devices, substrates are transferred into predetermined chambers of various manufacturing apparatuses such as a film forming apparatus, an etching apparatus, and an inspection equipment, and the substrates are subjected to processing corresponding to each apparatus. The substrate is carried into each apparatus by a transfer arm having a fork or an end effector, but it is conventionally known that the substrate has to be accurately disposed at a predetermined position within the chamber (see e.g., Japanese Patent Application Laid-open No. 2012-094814).

SUMMARY

According to an aspect of the present disclosure, a substrate processing apparatus transfers a plurality of substrates contained in a storage chamber to a substrate holder by a substrate transfer device, introduces the substrate holder into a reaction chamber by a substrate holder moving unit, and processes the plurality of substrates. The substrate processing apparatus includes: a substrate transfer controller that obtains a film thickness measurement result as a processing result of at least one substrate, determines a placement condition of the substrate holder and a substrate placement position on the substrate holder under the placement condition based on a model, a substrate transfer position setting value and a substrate holder setting value from the film thickness measurement result, and operates the substrate transfer device; an eccentricity status analysis unit that analyzes an eccentric state from a film thickness variation state when the film thickness measurement result is newly obtained; a learning function unit that updates the model based on the eccentric state analyzed by the eccentricity status analysis unit; and an optimization function unit that updates the placement condition of the substrate holder and the substrate placement position on the substrate holder under the placement condition based on the model updated by the learning function unit, the substrate transfer position setting value and the substrate holder setting value.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 5A to 5C are views illustrating an example of a control target and a control parameter.

FIG. 12 is a view illustrating an example of the film formation results of newly formed films input to an eccentricity status analysis unit.

FIG. 13 is a view illustrating an example of teaching positions input to a learning function unit.

FIG. 14 is a view illustrating an example of constraint conditions input to an optimization function unit.

FIG. 16 is a view illustrating an example of "the residual from the Edge average of the current Run" in the evaluation function J.

FIG. 17 is a view illustrating an example of constraint conditions.

DETAILED DESCRIPTION

Figure 1:
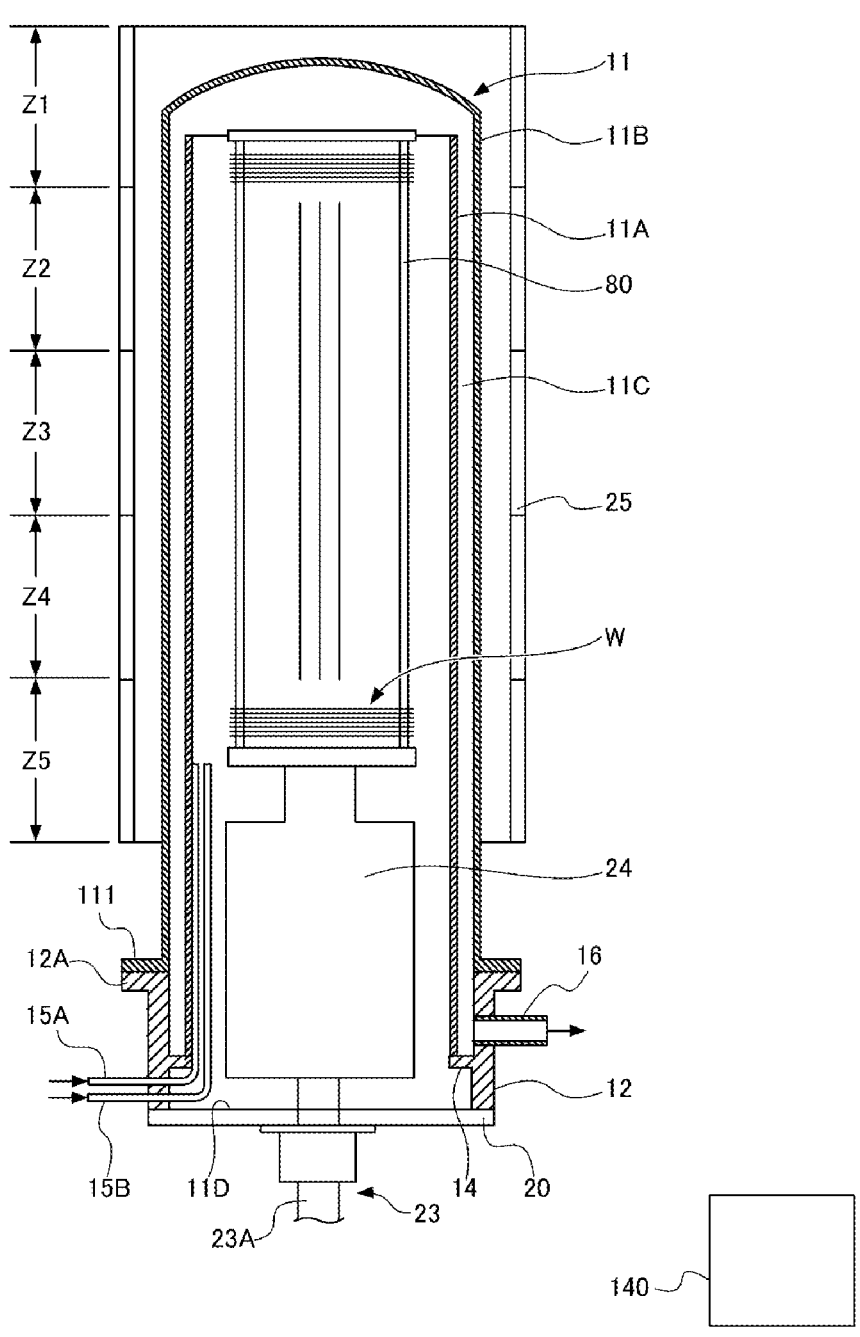
FIG. 1 is an explanatory sectional view illustrating the outline of the configuration in an example of a heat treatment apparatus.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments for carrying out the present disclosure will be described with reference to drawings. In the drawings, the same components are given the same reference numerals, and redundant descriptions thereof may be omitted in some cases.

First Embodiment

[Heat Treatment Apparatus]

Descriptions will be made on a heat treatment apparatus to which an eccentricity elimination program according to an embodiment of the present disclosure is suitably applicable.

FIG. 1 is an explanatory sectional view illustrating the outline of the configuration in an example of a heat treatment apparatus. The heat treatment apparatus includes a reaction chamber (process tube) 11 having a double-tube structure that includes a straight inner tube 11A having an open upper end and an outer tube 11B having a closed upper end. The inner tube 11A is disposed to extend in the height direction (the vertical direction in FIG. 1). The outer tube 11B is concentrically disposed with a predetermined gap such that a cylindrical space 11C is formed around the inner tube 11A. A space below the reaction chamber 11 is a loading area where wafers W as processing targets are transferred to/from a wafer boat 80 as a processing target holder to be described below. Then, both the inner tube 11A and the outer tube 11B are made of a material excellent in heat resistance and corrosion resistance, for example, high-purity quartz glass.

A short cylindrical manifold 12 having a flange portion 12A at the upper end thereof is provided at the lower end of the outer tube 11B in the reaction chamber 11. A lower end flange portion 111 provided at the lower end of the outer tube 11B is joined to the flange portion 12A via, for example, a sealing unit (not illustrated) such as an O ring, and the outer tube 11B of the reaction chamber 11 is airtightly fixed. The inner tube 11A in the reaction chamber 11 extends downward from the lower end surface of the outer tube 11B and is inserted into the manifold 12 while being supported by an annular inner tube support 14 provided on the inner surface of the manifold 12.

In the vertical section of the reaction chamber 11 of the heat treatment apparatus, a gas supply pipe 15A for introducing a processing gas into the reaction chamber 11 and a gas supply pipe 15B for introducing an inert gas are provided on one side wall of the manifold 12 while airtightly passing through the side wall of the manifold 12 and extending upwards inside the inner tube 11A. A gas supply source (not illustrated) is connected to each of the gas supply pipes 15A and 15B.

An exhaust pipe 16 for exhausting the inside of the reaction chamber 11 is provided on the other side wall of the manifold 12 while communicating with the cylindrical space 11C between the inner tube 11A and the outer tube 11B. An exhaust mechanism (not illustrated) having, for example, a vacuum pump and a pressure control mechanism, is connected to the exhaust pipe 16. Thus, the inside of the reaction chamber 11 is controlled to a predetermined pressure.

Below the reaction chamber 11, an elevating mechanism (not illustrated) is provided. The elevating mechanism is driven in the vertical direction and loads/unloads the wafer boat 80 into/from the reaction chamber 11. The elevating mechanism has a disk-shaped lid 20 that opens and closes a lower end opening 11D of the reaction chamber 11. A rotary driving unit 23 is provided on the lower portion of the lid 20 in a state where the rotary driving shaft 23A of the rotary driving unit 23 airtightly passes through the lid 20. The rotary driving shaft 23A is connected to the lower surface of a heat insulation tube (insulator) 24.

Figure 2:
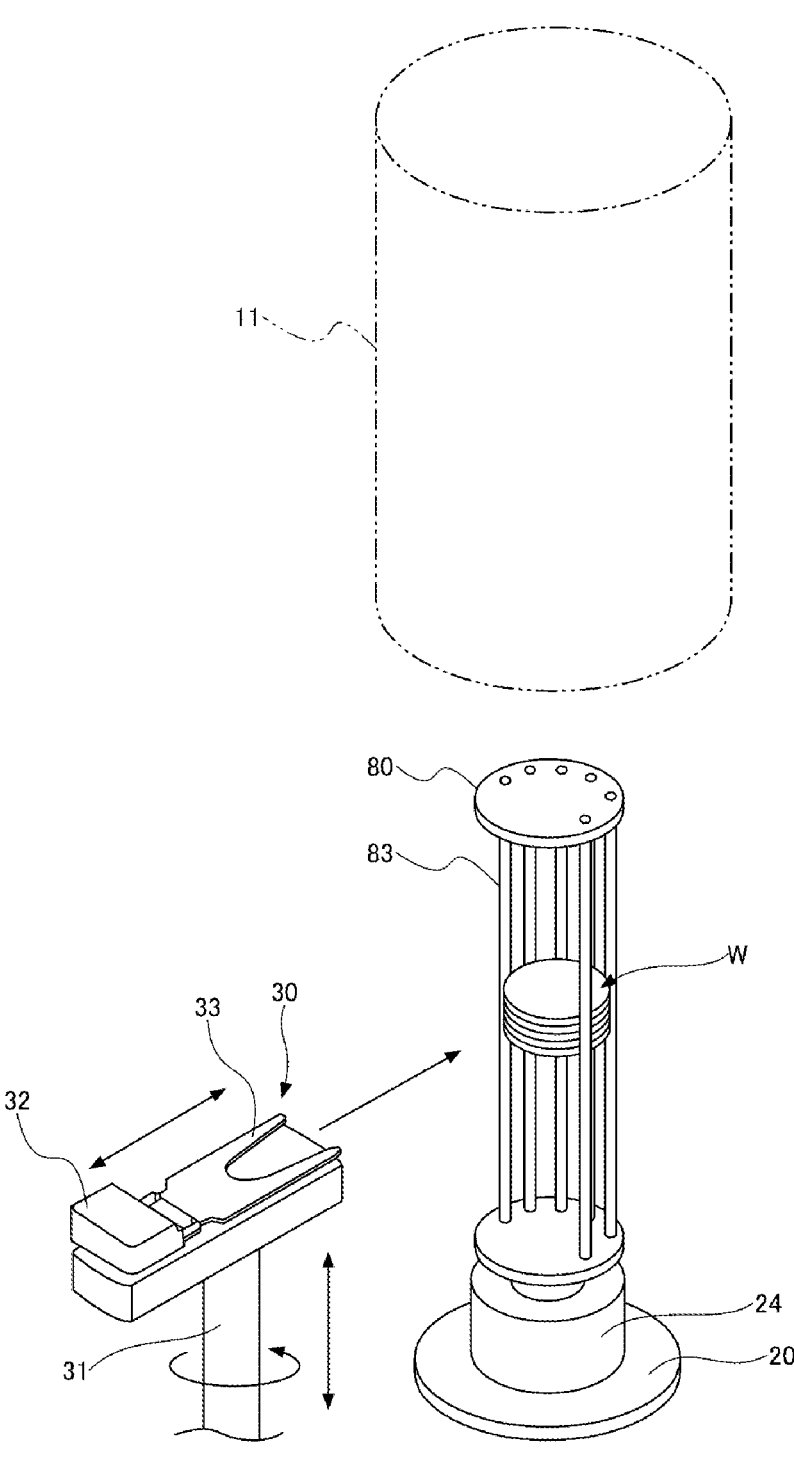
FIG. 2 is an explanatory perspective view illustrating the operation state of a transfer device in a heat treatment apparatus illustrated in FIG. 1, in relation to a wafer boat.

The wafer boat 80 is made of, for example, high-purity quartz glass. As illustrated in FIG. 2, processing target holding portions such as, for example, processing target retaining slots, are formed on a support pillar 83 such that a plurality of disk-shaped wafers W (e.g., about 100 to 150 wafers W), in a horizontal state, is vertically held in multiple stages, at a predetermined interval (pitch) within a range of, for example, 4 to 20 mm. In a state where the lid 20 is at the lowest position, the wafers W are transferred by a transfer device 30.

The transfer device 30 includes an elongated rectangular transfer head 32 that is vertically moved up and down and is rotatably provided around a vertically extending rotary shaft 31. The transfer head 32 is provided with, for example, 1 to 5 thin-plate fork-shaped support arms 33 such that the support arms 33 can advance and retreat in the longitudinal direction of the transfer head 32. The operation states of the transfer device 30, specifically, the vertical movement and the rotational movement of the transfer head 32, and the forward/backward movement of the support arms 33, are controlled by a control device (not illustrated).

A tubular heater 25, which is a heating unit for heating the wafers W accommodated within the reaction chamber 11, is provided outside the reaction chamber 11 while surrounding the periphery of the reaction chamber 11. The tubular heater 25 is provided with a cylindrical heat insulating material (not illustrated) in which a linear resistance heating element is arranged spirally or meanderingly on the inner surface. The resistance heating element is connected to a control device that controls the magnitude of power to be supplied so that the wafers W reach a preset temperature state.

For example, as illustrated in FIG. 1, in a state where the inside of the reaction chamber 11 is divided into a plurality of zones in the height direction, five heating zones Z1 to Z5 in the illustrated example, the tubular heater 25 is able to independently perform a temperature control for each of the heating zones Z1 to Z5, that is, a zone control.

Here, descriptions will be made on an example of processing conditions in film formation processing performed on the wafer W. For example, for a wafer W having a wafer diameter of 300 mm, the processing temperature at which the wafer W is to be processed is 400 to 700° C., and the pressure within the reaction chamber 11 is 13 to 170 Pa (0.1 to 1.3 Torr).

In the heat treatment apparatus configured as described above, as will be described in detail below, when film formation processing is actually performed on the wafer W, in a case where in-plane uniformity of a film is low on the surface of the film-formed wafer W, a transfer position optimization operation is performed to optimize a transfer position of a new wafer W with respect to the wafer boat 80. Then, again, the film formation processing is performed on the new wafer W under the same processing conditions.

Specifically, first, in a state where the control is performed on the movement of the transfer head 32 in the vertical direction and the rotational direction, and the forward/backward movement of the support arm 33, the wafers W are taken out of a storage chamber in which a large number of wafers W are accommodated and which has been transferred by an appropriate transfer unit (not illustrated). In a state where the lid 20 is at the lowest position, the wafers W are sequentially transferred to the wafer boat 80 waiting on the lid 20. Here, in each of the processing target holding portions in the wafer boat 80, the transfer position to which the wafer W is transferred is, for example, a position (hereinafter, referred to as a "set transfer position") at which the center position of the shape of the wafer W coincides with the center position of the rotation of the wafer boat 80 rotationally driven by the rotary driving unit 23. For example, simulated semiconductor wafers (dummy wafers) are placed on the uppermost and lowermost processing target holding portions in the wafer boat 80.

Then, as the lid 20 is driven upward by the elevating mechanism, the wafer boat 80 is carried into the reaction chamber 11 through the lower end opening 11D, and the lower end opening 11D of the reaction chamber 11 is placed in an airtightly closed state by the lid 20. Next, an exhaust unit is operated to decompress the inside of the reaction chamber 11 to a predetermined pressure, and the tubular heater 25 is operated so that each of the heating zones Z1 to Z5 in the reaction chamber 11 is heated to a target temperature at which the wafers W are to be processed. In this state, an appropriate film formation gas is introduced into the reaction chamber 11 from the gas supply pipe 15A so that film formation processing is performed on the wafers W. A controller 140 is an arithmetic processor for controlling the entire operation of the heat treatment apparatus, and may be constituted by, for example, a computer.

Figure 3:
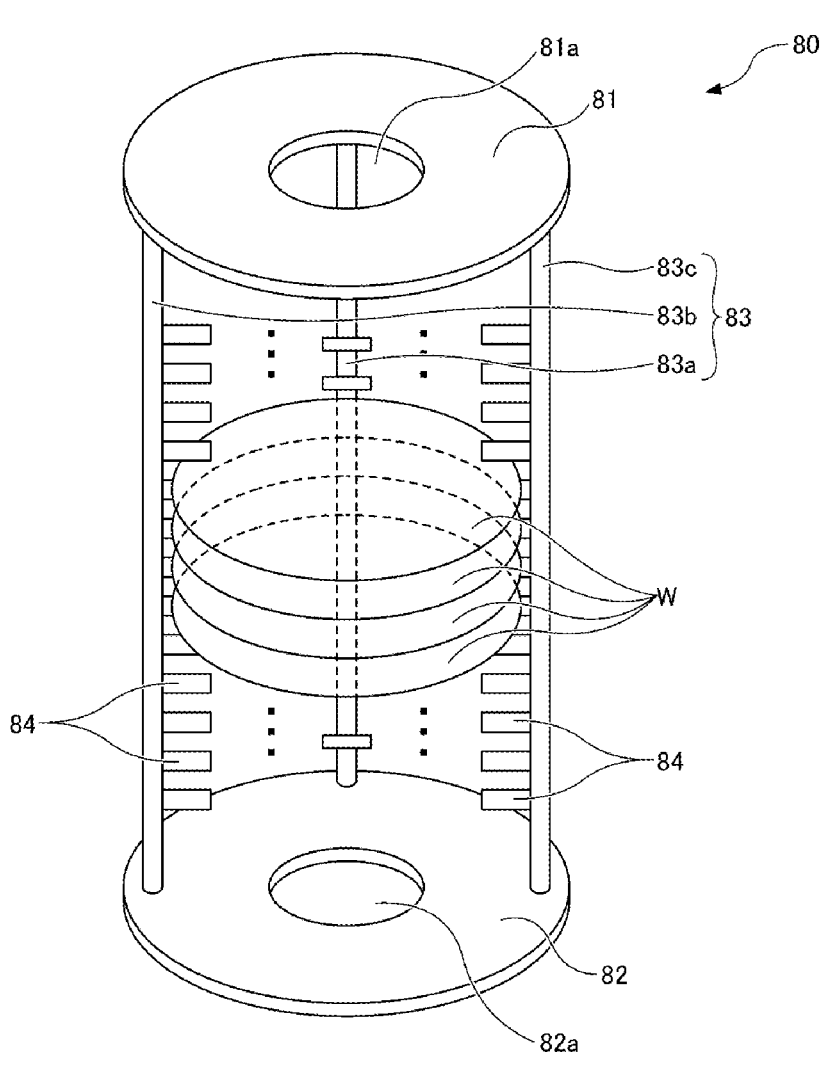
FIG. 3 is a view illustrating an example of the wafer boat that can be used for the heat treatment apparatus.

Next, descriptions will be made on an example of the wafer boat 80 used for the heat treatment apparatus by using FIG. 3. FIG. 3 is a view illustrating an example of the wafer boat 80 that can be used for the heat treatment apparatus.

As illustrated in FIG. 3, the wafer boat 80 includes a top plate 81 and a bottom plate 82, and includes a support pillar 83 between the top plate 81 and the bottom plate 82. FIG. 3 illustrates an example in which three support pillars 83 are provided. The number of the support pillars 83 can be set variously depending on applications as long as it is three or more, and can be set to, for example, four.

Each support pillar 83 has supporting portions 84 vertically formed at predetermined intervals. The supporting portion 84 protrudes inward in a small flat plate shape like a hook, and thus may be called a hook. The spacing between the supporting portions 84 may be appropriately set according to applications, but may be set as a spacing that allows, for example, 50 to 150 wafers W to be arranged in one wafer boat 80 as described above. The supporting portion 84 may have any shape as long as it can support the wafer W, but may be formed in, for example, a rectangular shape having a horizontal surface extending toward the center. The respective supporting portions 84 of the support pillars 83, which support the same wafer W, are set at the same height so that the wafer W can be supported in a horizontal state. In a case where there are three support pillars 83, when viewed from the front where the wafers W are mounted, one support pillar 83a is arranged at the inside center, and the other two support pillars 83b and 83c are arranged symmetrically with respect to the support pillar 83a.

The top plate 81 and the bottom plate 82 may be formed in ring shapes having an opening 81a and an opening 82a, respectively, in the central regions thereof. Further, in addition to the support pillars 83, if necessary, the wafer boat 80 may include a reinforcing pillar. The reinforcing pillar is a support pillar that is provided for reinforcement in order to increase the strength of the wafer boat 80, and does not have the supporting portions 84 that support the wafers W. In a configuration example, one reinforcing pillar may be provided between the inside center support pillar 83a and the left support pillar 83b, and one reinforcing pillar may be provided between the inside center support pillar 83a and the right support pillar 83c. The wafer boat 80 may be made of various materials depending on the applications, including quartz that is the same material as the wafer boat support.

In the heat treatment apparatus having such a configuration, when film formation is performed, the transfer device 30 is used to transfer the wafers W onto the wafer boat 80 placed on the lid 20, and the lid 20 is raised to accommodate the wafers W within the reaction chamber 11. Then, the exhaust unit is operated to depressurize the inside of the reaction chamber 11 to a predetermined pressure, and the tubular heater 25 is operated so that each of the heating zones Z1 to Z5 in the reaction chamber 11 is heated to a target temperature at which the wafers W are to be processed. In this state, an appropriate film formation gas is introduced into the reaction chamber 11 from the gas supply pipe 15A so that film formation processing is performed on the wafers W.

Here, the gas supply pipe 15A is provided outside the wafers W, the distance from the gas supply pipe 15A varies depending on in-plane positions of the wafer W, and the wafers W are also stacked in the vertical direction. Thus, in some cases, the amount of processing gas adsorbed on the wafer W may differ between in-plane and upper/lower positions of the wafers W. Further, the same also applies to the exhaust, and in some cases, a subtle difference may occur between in-plane and upper/lower positions of the wafers W.

Due to such a difference, including a difference between vertical positions of the wafers W, when a film is formed on the wafer W, in some cases, a difference between the film thicknesses may occur within the plane of the wafer W. It is desirable that the film thickness of the thin film formed on the wafer W is uniform within the plane of the wafer W, and it is desirable that the in-plane uniformity is good. Hereinafter, a deviation of film thickness distribution, in which film thicknesses within the plane (e.g., the edge) of the wafer W are not uniform due to the position of the wafer W placed on the wafer boat 80, is called eccentricity. It was necessary to eliminate the eccentricity in order to maximize the process performance.

The eccentricity has conventionally been improved by adjusting the positions of the wafers W placed on the wafer boat 80 by an operator based on experience and intuition. However, there is no indicator of how much eccentricity should be improved, and adjustments have been performed until the operator determines optimum positions through trial and error. Since the eccentricity improvement is a work dependent on the skill of the operator in this manner, the time required for improvement has varied according to the operator. In the present embodiment, a program for eliminating the eccentricity, which will be described below, is used so that the eccentricity can be simply eliminated in a short time regardless of the operator.

The eccentricity elimination program according to the present embodiment optimizes the placement position (teaching position) of the wafer W, which is to be designated in the transfer device 30, as described below. According to the designated teaching position, the transfer device 30 places the wafer W on the supporting portions 84 of the wafer boat 80 by shifting the support arm 33 little by little in the front and rear direction and in the rotational direction.

Figure 4:
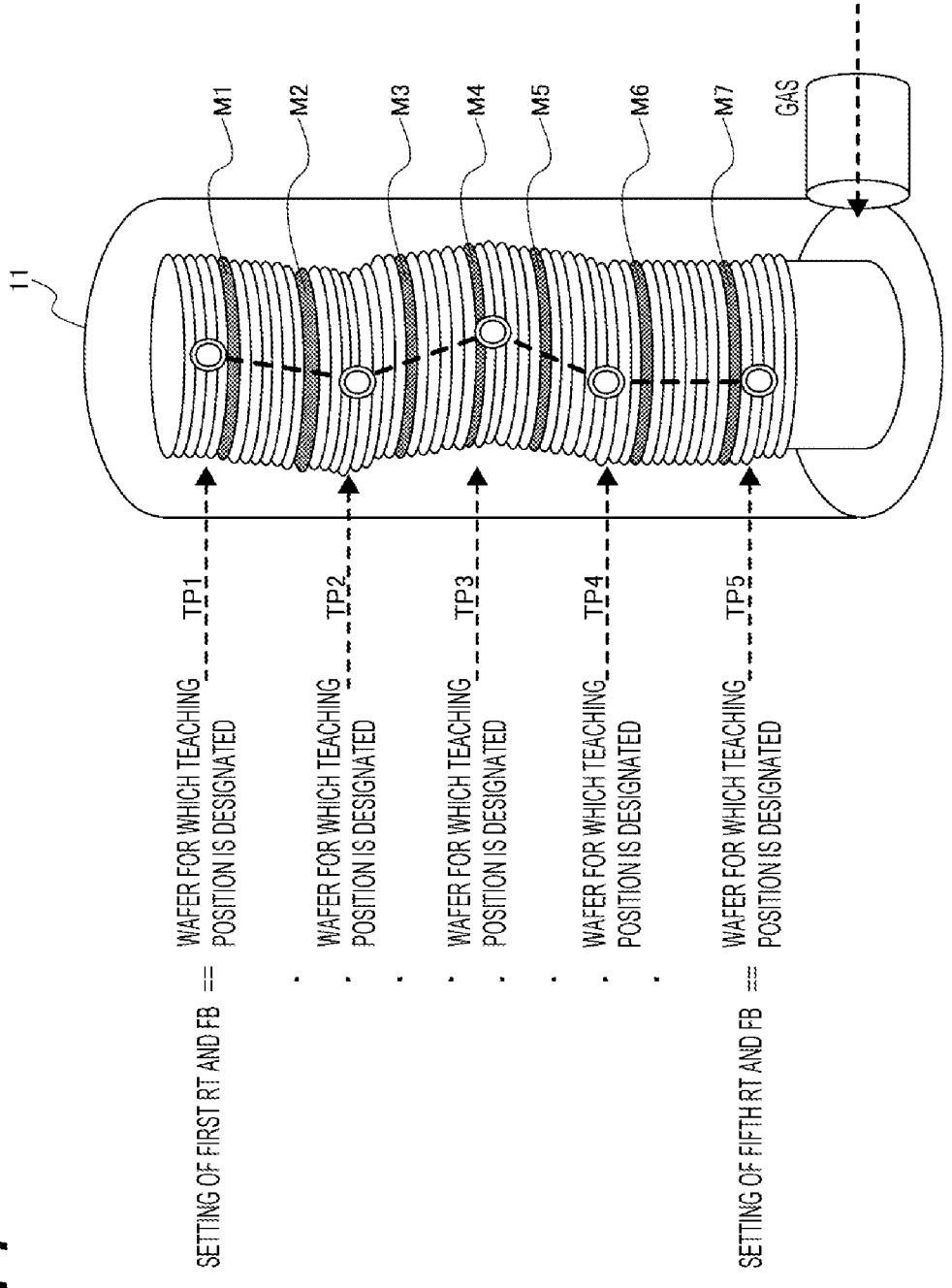
FIG. 4 is a view for explaining an example of placement positions of wafers W.

FIG. 4 is a view for explaining an example of placement positions of the wafers W. FIG. 4 illustrates an example in which teaching positions TP1 to TP5 are designated for five setting points [five wafers W]. Further, in FIG. 4, the wafer boat 80 is omitted, and an example of arrangement of the wafers W within the reaction chamber 11 is illustrated.

For example, when a plurality of wafers W is disposed and is subjected to heat treatment in one batch, the teaching positions indicate that the center positions of the wafers W positioned at a plurality of setting points in the vertical direction are designated as placement positions. The number of setting points for which the teaching positions are to be designated is not particularly limited as long as it is plural, but is, for example, two to five. For example, FIG. 4 illustrates an example in which teaching positions are designated for five wafers W among 56 stacked wafers W.

The center positions of the wafers W other than the wafers W for which teaching positions are designated are linearly interpolated with the center positions of the upper and lower wafers W for which the teaching positions are designated. The teaching position is designated by the movement amount of the support arm 33 in the front and rear direction from the base position, and the movement amount in the rotational direction.

Accordingly, the support arm 33 can dispose the wafer W on the supporting portions 84 by being shifted little by little in the front and rear direction and the rotational direction of the support arm 33 from, the base position of the wafer boat 80. As described above, in the present embodiment, when the film formation processing is performed, it is possible to variously move the positions of the wafers W to be placed on the wafer boat 80, from the base position, according to the teaching positions designated for the five setting points.

In FIG. 4, monitor wafers M1 to M7 whose film thicknesses are to be measured are set. A freely selected number of monitor wafers M1 to M7 can be set in sections defined above and below the setting points for which the teaching positions TP1 to TP5 are designated.

FIG. 4 illustrates an example in which two monitor wafers M1 and M2, M3 and M4, and M6 and M7 are provided in each of three sections, between setting points for which teaching positions TP1 and TP2 are designated, between setting points for which teaching positions TP2 and TP3 are designated, and between setting points for which teaching positions TP4 and TP5 are designated. Also, one monitor wafer M5 is provided in one section between setting points for which teaching positions TP3 and TP4 are designated.

This installation is merely an example. At least three wafers W may be set as monitor wafers, and the number of sheets can be set according to applications. Setting points for which teaching positions TP1 to TP5 are designated may or may not match the monitor wafers M1 to M7. FIG. 4 illustrates an example in which the wafers W at setting points for which teaching positions TP1 to TP5 are designated are different from all of the monitor wafers M1 to M7.

Figures 5A, 5B, 5C:
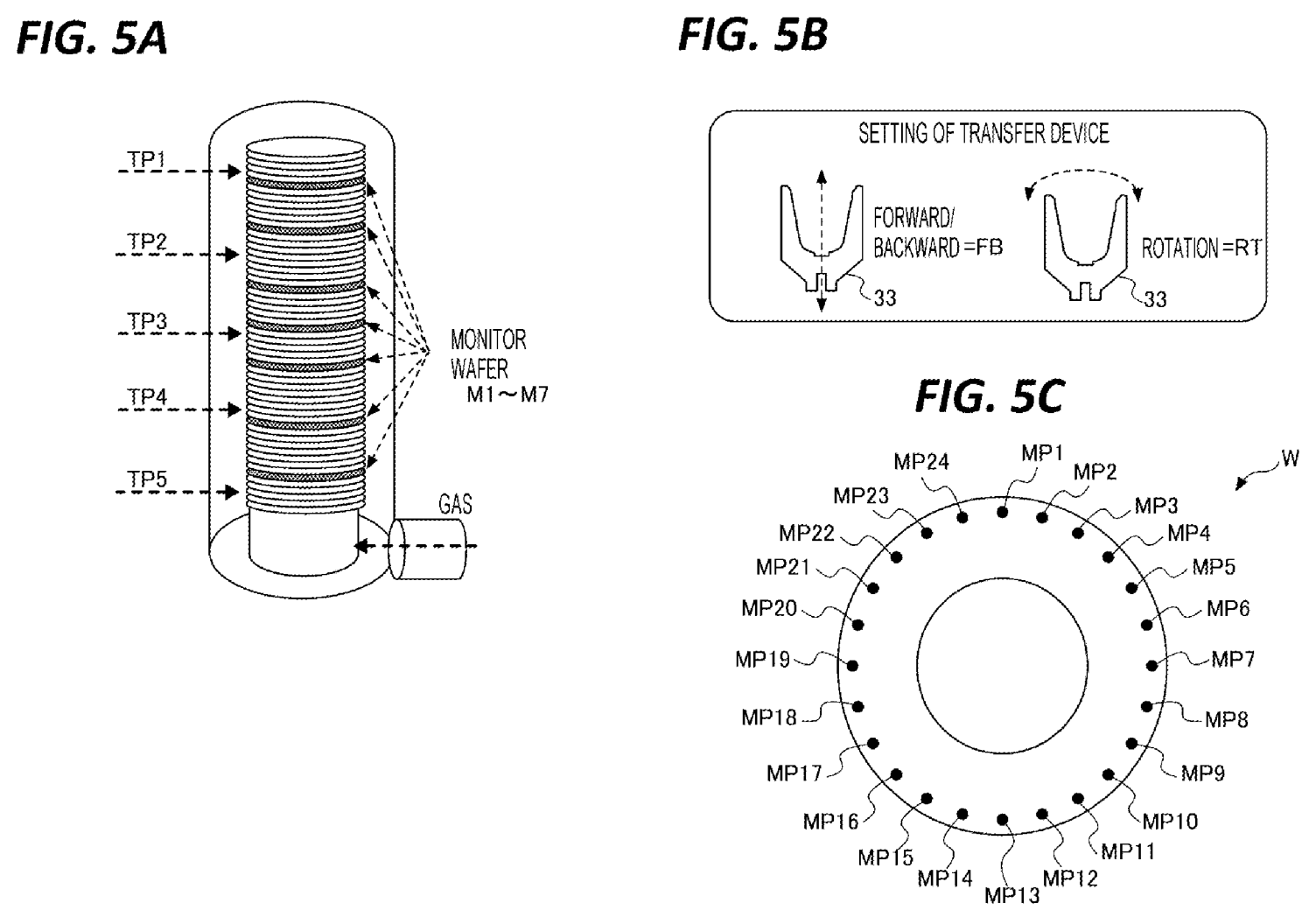

FIGS. 5A to 5C are views illustrating an example of a control target and a control parameter. FIG. 5A is a view illustrating an example of the positional relationship between the wafers W at setting points for which the teaching positions TP1 to TP5 are designated, and the monitor wafers M1 to M7, in the vertical direction. Although the positional relationship in FIG. 5A is the same as that in FIG. 4, since all of the teaching positions TP1 to TP5 are designated at the base position, all of the wafers W are placed on the same base position.

FIG. 5B is a view illustrating an example of control parameters. As for the control parameters, there are two settings, the front and rear direction of the support arm 33 (hereinafter, abbreviated as "FB" in some cases), and the rotational direction (hereinafter, abbreviated as "RT" in some cases).

For the front and rear direction, for example, the movement to the rear side (position shift) may be displayed as a plus, and the movement to the front side may be displayed as a minus. The rotational direction is indicated by the rotation angle of the support arm 33. For example, the right rotation and the left rotation may be displayed as a plus and a minus, respectively.

Assuming that there are two settings as control parameters, FB and RT, and there are 2 to 5 setting points for which teaching positions are designated, at least 2×2=4 control conditions can be set, and at most 2×5=10 control conditions can be set. These control conditions that can be set may be called control knobs in some cases. The number of control knobs indicates the number of control conditions that can be changed.

FIG. 5C is a view illustrating an example of monitoring points of a monitor wafer. The monitoring points MP can be set at freely selected positions within the plane of the wafer W, but may be arranged along the circumferential direction in a region near, for example, the outer periphery of the wafer W. FIG. 5C illustrates an example in which 24 monitoring points MP1 to MP24 are provided.

In order to grasp the in-plane uniformity, it is effective to measure the film thickness balance at the edge of the wafer W. When 24 monitoring points MP (film thickness measurement points) are set, control targets corresponding to the number of monitor wafers can be set. For example, as illustrated in FIG. 5A, when seven wafers W are set as monitor wafers M1 to M7, 168 control targets (=24 points×7 sheets) can be set.

When 13 monitor wafers M1 to M13 are set, 312 control targets (=24 points×13 sheets) can be set. The reason why the monitoring points are called control targets is that when a control is performed to reduce film thickness variations in the monitoring points MP, the purpose of film thickness control of improving the in-plane uniformity is achieved.

Meanwhile, in some cases, the wafer W cannot be transferred to the wafer boat 80 in accordance with the optimized teaching position. The wafer W is transferred to the processing target holding portions of the wafer boat 80 to be carried into the reaction chamber 11. However, depending on the placement position of the wafer boat 80 within the reaction chamber 11 (hereinafter, also referred to as a "wafer boat placement position"), when an attempt is made to transfer the wafer W to the optimized teaching position, the wafer may not fit within the range of the processing target holding portions. Meanwhile, when the teaching position is optimized within a range where the wafer can be transferred to the processing target holding portions in consideration of the wafer boat placement position, the amount of improvement in eccentricity is limited.

Figure 6:
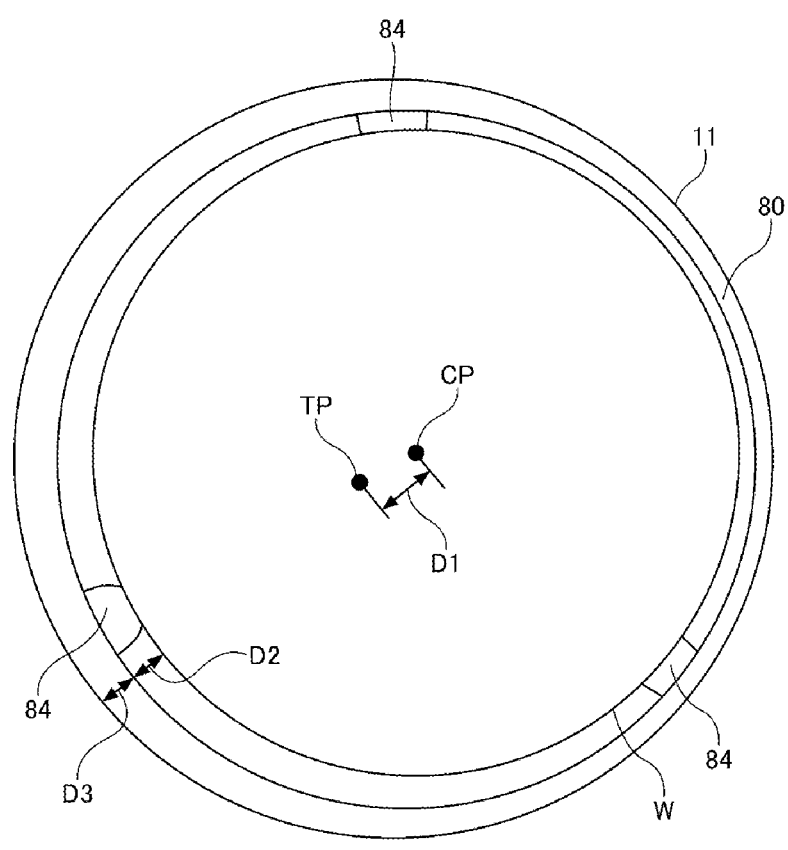
FIG. 6 is a view illustrating an example of a case where the wafer cannot be transferred to the teaching position.

FIG. 6 is a view illustrating an example of a case where the wafer cannot be transferred to the teaching position. In the example of FIG. 6, within the reaction chamber 11, the wafer boat 80 is placed at a position shifted to the upper right direction. Here, if the distance D1 between the center position CP of the wafer W and the optimized teaching position TP is larger than the distance D2 over which the wafer W can be moved within the wafer boat 80, the wafer W cannot be transferred according to the teaching position TP.

Meanwhile, in some cases, it is possible to transfer the wafer W according to the optimized teaching position TP by changing the wafer boat placement position. In the example of FIG. 6, if the sum of the distance D3 over which the wafer boat 80 can be moved within the reaction chamber 11, and the distance D2 over which the wafer W can be moved within the wafer boat 80 is larger than the distance D1 between the center position CP of the wafer W and the teaching position TP, it is possible to transfer the wafer W according to the teaching position TP by changing the wafer boat placement position.

The eccentricity elimination program according to the present embodiment optimizes the wafer boat placement position as well as the teaching position. If the optimized teaching position exceeds an adjustable range for the teaching position, the eccentricity elimination program outputs an optimized wafer boat placement position. The operator can adjust the placement position of the wafer boat 80 within the reaction chamber 11 according to the output wafer boat placement position so as to improve eccentricity. If the heat treatment apparatus can automatically adjust the placement position of the wafer boat 80, the placement position of the wafer boat 80 within the reaction chamber 11 may be automatically adjusted according to the output wafer boat placement position.

[Information Processing System in which Eccentricity Elimination Program is Executed]

Figure 7:
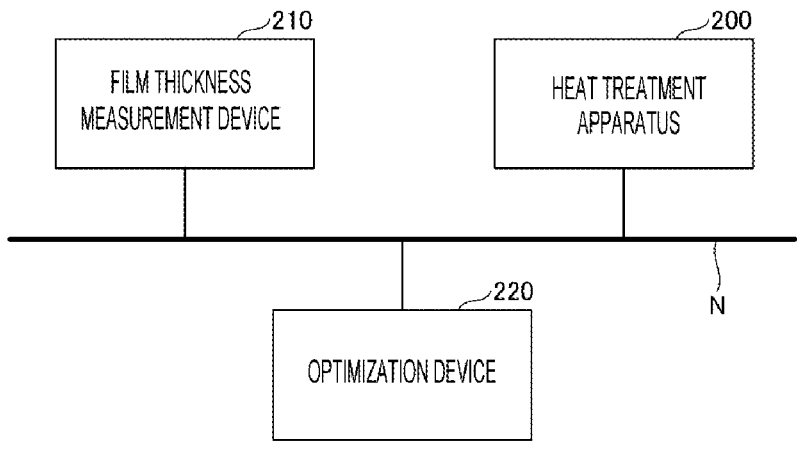
FIG. 7 is a configuration diagram of an example of an information processing system according to a first embodiment.

FIG. 7 is a configuration diagram of an example of an information processing system according to the present embodiment. In the information processing system illustrated in FIG. 7, a heat treatment apparatus 200, a film thickness measurement device 210, and an optimization device 220 are connected via a communication network (N) such as the Internet or LAN in such a manner that data communication is possible. The information processing system in FIG. 7 is an example, and data may be moved via a recording medium such as a USB instead of the communication network (N).

As described with reference to FIG. 1 to FIGS. 5A to 5C, in the heat treatment apparatus 200, the wafers W are transferred to the wafer boat 80 by the transfer device 30, the wafer boat 80 on which the wafers W are placed is accommodated within the reaction chamber 11, and then films are formed on the wafers W. The teaching position that is designated in the transfer device 30 in order to transfer the film-formed wafer W to the wafer boat 80 is input to the optimization device 220 automatically or according to the operation of the operator. Further, the wafer boat placement position where the wafer boat 80 is placed within the reaction chamber 11 is input to the optimization device 220 automatically or according to the operation of the operator.

The wafer boat placement position is the coordinates of the central point of the wafer boat 80 when the reaction chamber 11 is viewed from above. Any coordinate system may be employed to indicate a wafer boat placement position. For example, by using a rotating coordinate system, it is possible to express an angle and a distance from the central point of the wafer boat 80, with the central point of the reaction chamber 11 as the origin. For example, by using an orthogonal coordinate system, the distance from the central point of the wafer boat 80 in the vertical/horizontal directions may be expressed with the central point of the reaction chamber 11 as the origin.

The film thickness measurement device 210 measures film thicknesses at the monitoring points MP1 to MP24 of the monitor wafers M1 to M7 of FIG. 5C among the wafers W on which films are formed by the heat treatment apparatus 200. The film thickness measurement result at the monitoring points MP1 to MP24 of the monitor wafers M1 to M7, which is obtained by the film thickness measurement device 210, is input to the optimization device 220 automatically or according to the operation of the operator.

The optimization device 220 is an information processing device in which the eccentricity elimination program according to the present embodiment is executed. By using the pre-created model to be described below, the input film thickness measurement result, the input wafer boat placement position, and the input teaching position, the optimization device 220 calculates the wafer boat placement position that is expected to minimize the effect of eccentricity as described below, and the teaching position that is expected to minimize the effect of eccentricity at the wafer boat placement position.

To the operator, the optimization device 220 may express, through displaying, the calculated wafer boat placement position that is expected to minimize the effect of eccentricity, the teaching position that is expected to minimize the effect of eccentricity at the wafer boat placement position, and the degree of eccentricity improved when a film is formed by using the teaching position. The information processing system of FIG. 7 is an example, and the heat treatment apparatus 200 and the optimization device 220 may be integrated. In the information processing system, the optimization device 220 may be functionally divided into a plurality of devices.

[Hardware Configuration]

Figure 8:
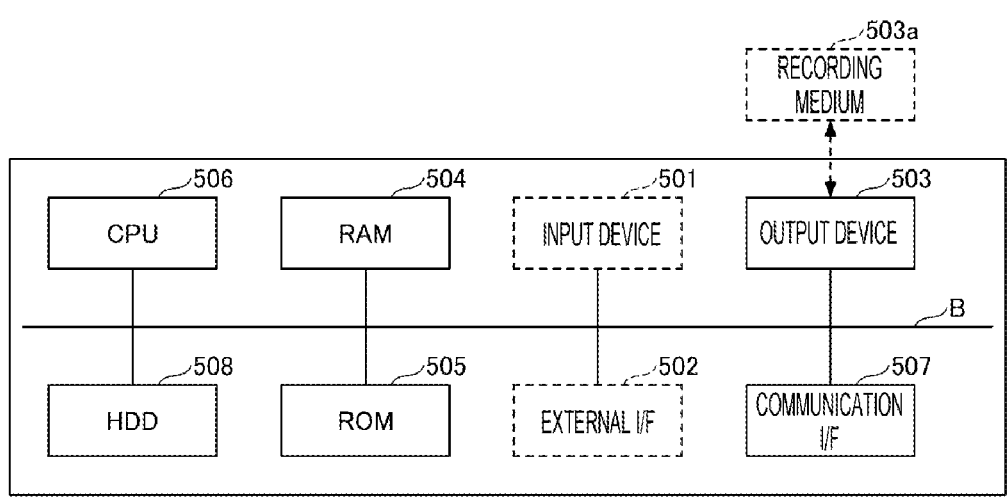
FIG. 8 is a hardware configuration diagram of an example of a computer according to the first embodiment.

The optimization device 220 of FIG. 7 is realized by, for example, a computer having a hardware configuration illustrated in FIG. 8. FIG. 8 is a hardware configuration diagram of an example of a computer according to the present embodiment.

The computer in FIG. 8 includes, for example, an input device 501, an output device 502, an external I/F 503, a RAM 504, a ROM 505, a CPU 506, a communication I/F 507, and an HDD 508, which are connected to each other via a bus B. In another mode, the input device 501 and the output device 502 may be connected for use if necessary.

The input device 501 is, for example, a touch panel, operation keys or buttons, or a keyboard or a mouse, which is used for input. The output device 502 is constituted by, for example, a liquid crystal or organic EL display for displaying a screen, and a speaker for outputting sound data such as voice or music. The communication I/F 507 is an interface through which a computer is connected to a communication network N. The HDD 508 is an example of a non-volatile storage device that stores programs or data. A drive device using a flash memory (e.g., a solid state drive: SSD) may be used instead of the HDD 508.

The external I/F 503 is an interface with an external device. The external device includes, for example, a recording medium 503a. Thus, the computer can perform reading and/or writing from/into the recording medium 503a via the external I/F 503. The recording medium 503a includes, for example, a flexible disk, a CD, a DVD, a SD memory card, and a USB memory.

The ROM 505 is an example of a non-volatile semiconductor memory (storage device) that can hold programs or data even if the power is turned off. The RAM 504 is an example of a volatile semiconductor memory (storage device) that temporarily holds programs or data. The CPU 506 is an arithmetic device that realizes the control or functions of the entire computer by reading programs or data from a storage device such as the ROM 505 or the HDD 508 onto the RAM 504, and executing processing. The optimization device 220 according to the present embodiment can realize various processes illustrated in the present embodiment by executing, for example, the eccentricity elimination program according to the present embodiment in the computer having the above-described hardware configuration.

The hardware configuration of the computer in FIG. 8 is an example, and for example, a smart phone or a tablet terminal, or a distributed processing system using a plurality of computers may be employed.

[Functional Blocks]

Figure 9:
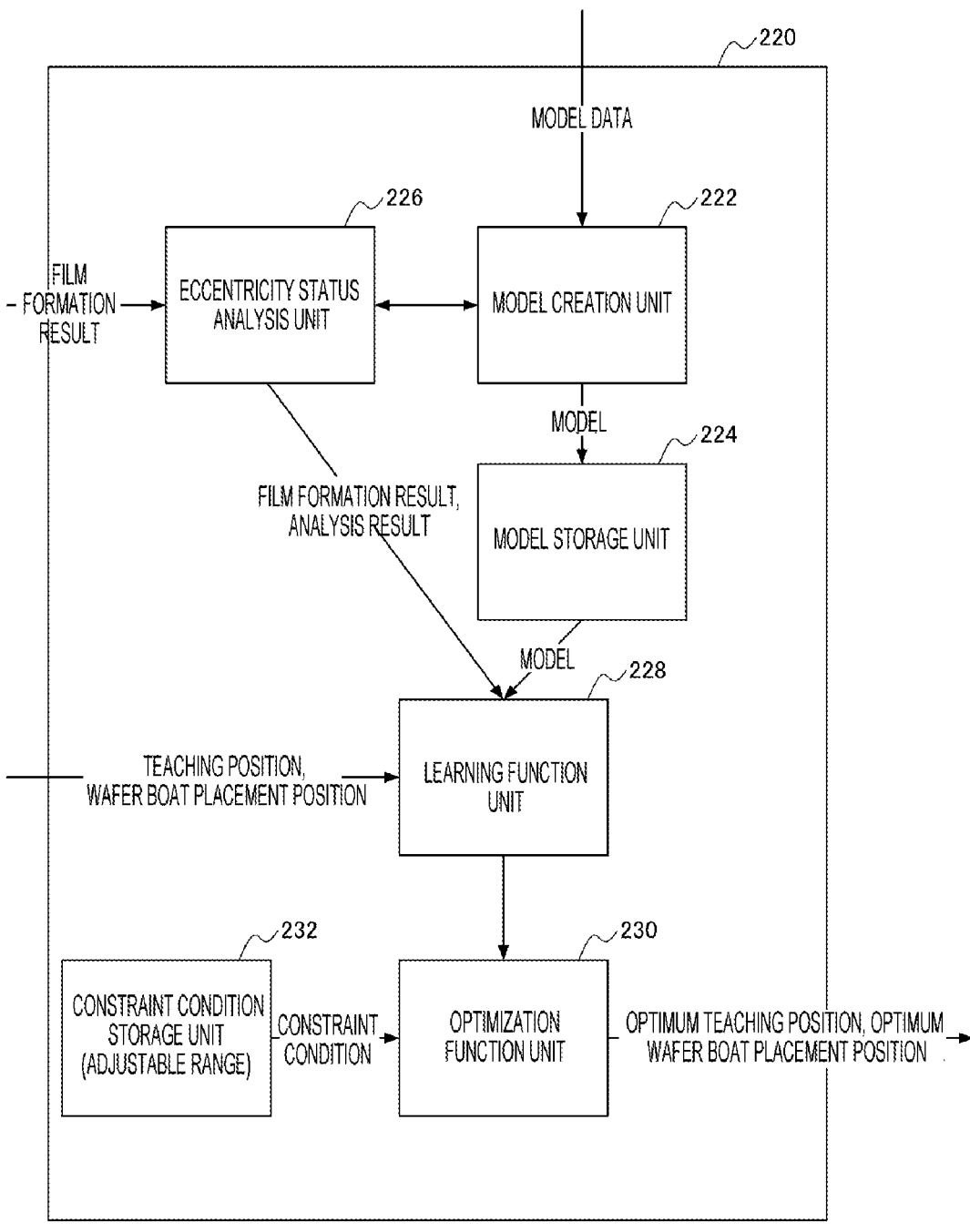
FIG. 9 is a functional block diagram of an example of an optimization device according to the first embodiment.

Next, descriptions will be made on functional blocks of the optimization device 220 according to the present embodiment. FIG. 9 is a functional block diagram of an example of the optimization device according to the present embodiment. The optimization device 220 realizes a model creation unit 222, a model storage 224, an eccentricity status analysis unit 226, a learning function unit 228, an optimization function unit 230, and a constraint condition storage 232 by executing the eccentricity elimination program according to the present embodiment.

To the model creation unit 222, results (results of multiple Runs) obtained by previously performing film formation with a plurality of control knobs can be input as model data. The model data includes the film thicknesses of the monitoring points MP1 to MP24 of the monitor wafer for each Run, a teaching position, and a wafer boat placement position. The model creation unit 222 creates a model by using the model data. The created model represents how the eccentric state changes according to the changes in the wafer boat placement position and the teaching position, which is expressed as a mathematical formula. The model storage 224 stores the model.

To the eccentricity status analysis unit 226, the film formation result of a newly formed film is input. The film formation result includes the film thickness measurement result of the monitoring points MP1 to MP24 of the monitor wafer. The eccentricity status analysis unit 226 analyzes the eccentric state by evaluating variations in the input film thicknesses of the monitoring points MP1 to MP24.

The learning function unit 228 provides a learning function. The learning function unit 228 receives the film formation result and the analysis result input from the eccentricity status analysis unit 226, the teaching position corresponding to the film formation result and the analysis result (an example of a setting value of a "substrate transfer position"), the wafer boat placement position corresponding to the film formation result and the analysis result (an example of a "substrate holder setting value" in the present embodiment), and the model stored in the model storage 224 so as to perform learning. More specifically, the learning function unit 228 checks whether there is an error in the model stored in the model storage 224 by using the film formation result and the analysis result input from the eccentricity status analysis unit 226, the teaching position corresponding to the film formation result and the analysis result, and the wafer boat placement position corresponding to the film formation result and the analysis result. If there is an error, the learning function unit 228 corrects the model.

In the constraint condition storage 232, the adjustable range of the teaching position is stored as constraint conditions. When the model corrected by the learning function unit 228 and the constraint conditions are input, the optimization function unit 230 performs optimization calculations so as to calculate the optimum wafer boat placement position that is expected to minimize the effect of eccentricity, and the optimum teaching position at the wafer boat placement position. If the calculated optimum teaching position is within the range of the constraint conditions, the optimization function unit 230 outputs the teaching position. If the calculated optimum teaching position is out of the range of the constraint conditions, the optimization function unit 230 outputs the calculated optimum wafer boat placement position, and the teaching position at the wafer boat placement position.

When outputting the calculated optimum wafer boat placement position, and the optimum teaching position at the wafer boat placement position, the optimization device 220 displays, in a drawing or a table, the degree of eccentricity (amount of improvement) improved when the film is formed using the wafer boat placement position and the teaching position. Therefore, after checking the amount of eccentricity improvement, the operator can determine whether to use the current wafer boat placement position and the teaching position as they are, or to use the newly calculated optimum wafer boat placement position and the teaching position.

[Processing]

Hereinafter, the processing of the optimization device 220 according to the present embodiment will be described in detail.

Figure 10:
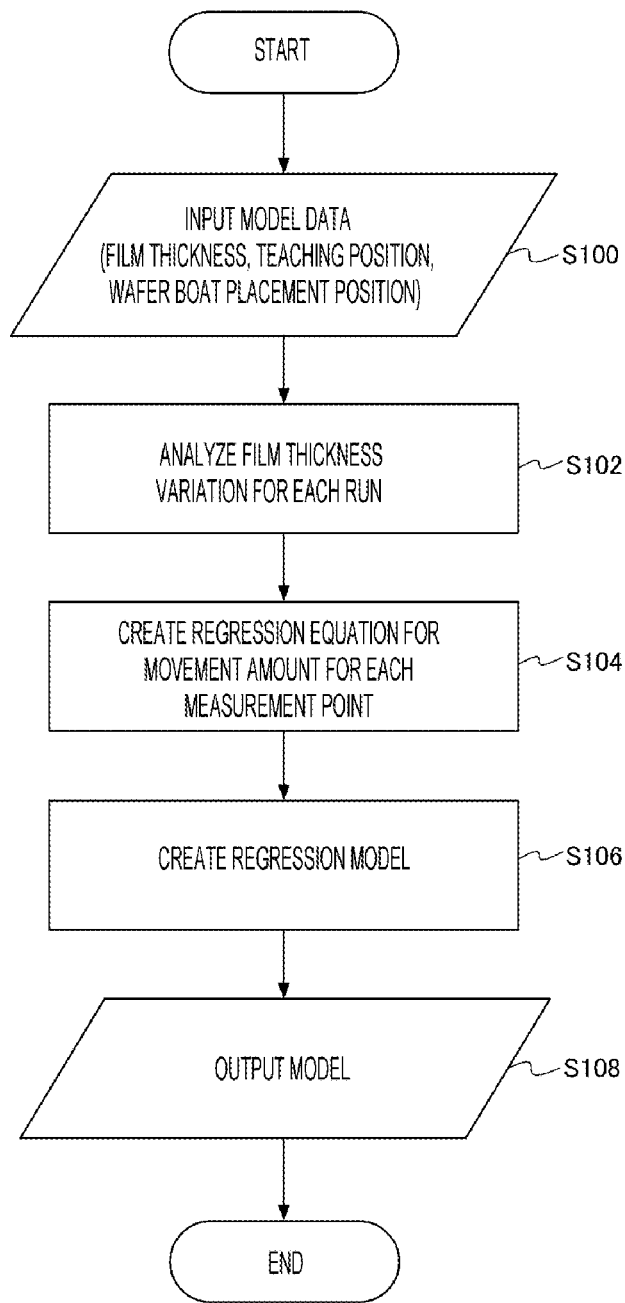
FIG. 10 is a flow chart of an example of model creation processing according to the first embodiment.

FIG. 10 is a flow chart of an example of model creation processing according to the present embodiment. In step S100, to the model creation unit 222, results of multiple Runs can be input as model data. The model data includes the film thicknesses of the monitoring points MP1 to MP24 of the monitor wafer for each Run, a teaching position, and a wafer boat placement position.

Figures 11A, 11B:
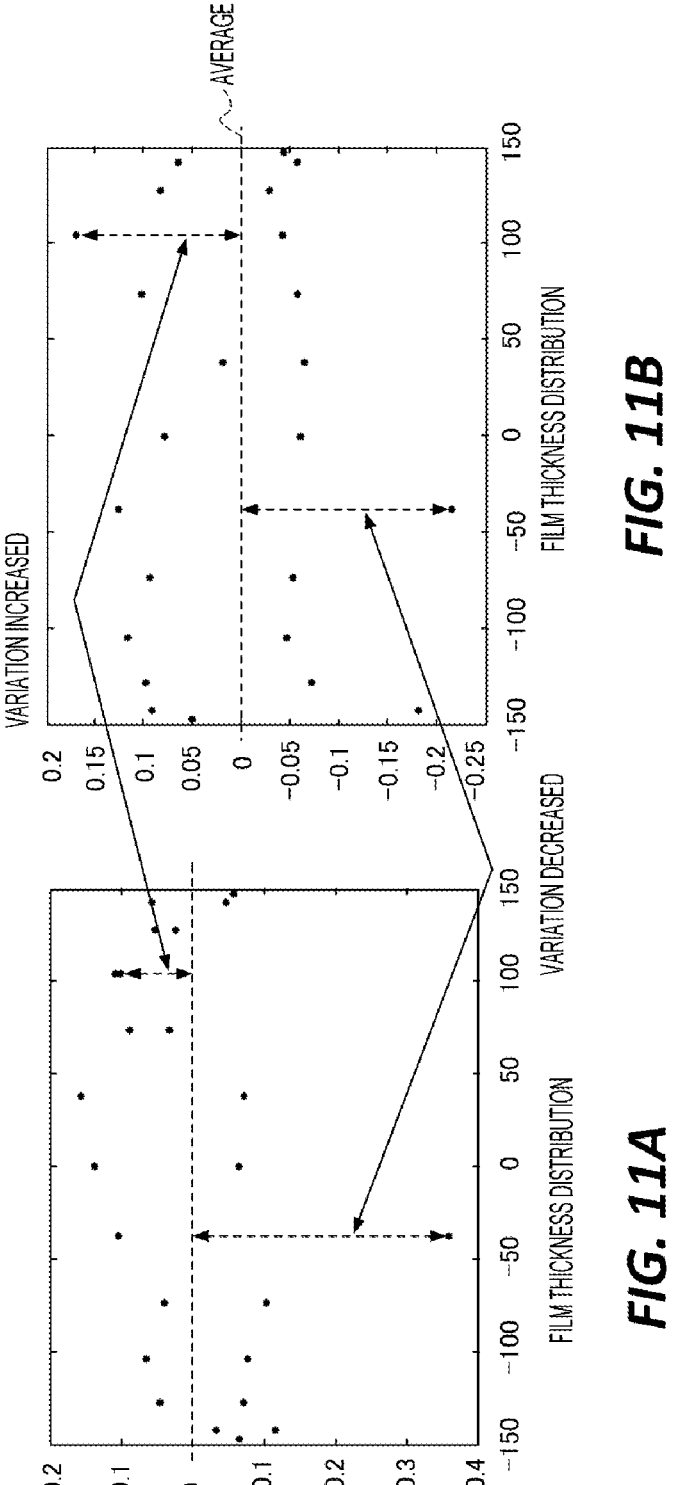
FIGS. 11A and 11B are views illustrating an example of film thickness variation evaluation.

In step S102, the model creation unit 222 causes the eccentricity status analysis unit 226 to analyze the film thickness variation evaluation for each Run. FIGS. 11A and 11B are views illustrating an example of film thickness variation evaluation. The film thickness variation evaluation is performed by obtaining the average of the film thicknesses of the monitoring points MP1 to MP24 of the monitor wafer, and processing the film thickness variations of the monitoring points MP1 to MP24 with a ratio to the average. Through this processing, even if the overall average film thickness changes due to changes in control conditions such as a film formation temperature or a film formation time, the film thickness variation evaluation can be performed with the same criteria.

In step S104, the model creation unit 222 creates a regression equation of the film thickness variation evaluation value with respect to a movement amount from the base position, for each of measurement points which are monitoring points MP1 to MP24.

In step S106, the model creation unit 222 creates a regression model by using the created regression equation. In step S108, the model creation unit 222 outputs the created model.

<Operation>

To the eccentricity status analysis unit 226, for example, the film formation result of a newly formed film is input as illustrated in FIG. 12. FIG. 12 is a view illustrating an example of the film formation results of the newly formed films input to the eccentricity status analysis unit. In FIG. 12, the monitoring points MP1 to MP24 are indicated by measurement point numbers "1" to "24." FIG. 12 illustrates an example in which five wafers W are monitor wafers. To the eccentricity status analysis unit 226, the film thicknesses of the monitoring points MP1 to MP24 are input for each monitor wafer.

To the learning function unit 228, for example, teaching positions illustrated in FIG. 13 are input. FIG. 13 is a view illustrating an example of teaching positions input to the learning function unit. To the optimization function unit 230, for example, as illustrated in FIG. 14, adjustable ranges of teaching positions are input as constraint conditions. FIG. 14 is a view illustrating an example of constraint conditions input to the optimization function unit.

Figure 15:
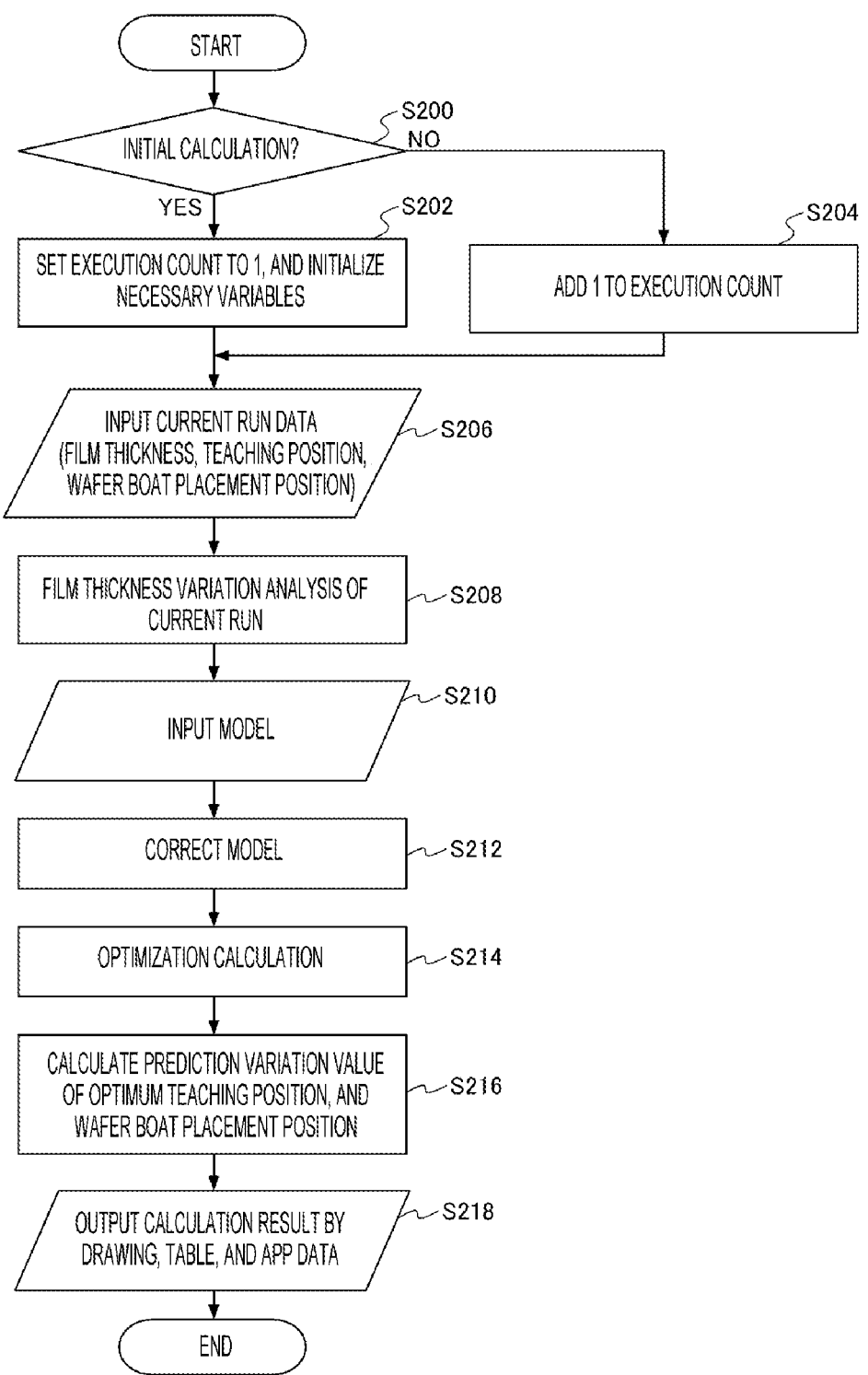
FIG. 15 is a flow chart of an example of the operation of the optimization device according to the first embodiment.

The optimization device 220 according to the present embodiment is operated as in FIG. 15 by using the created model, the film formation result of the newly formed film, the teaching position, the wafer boat placement position, and the constraint conditions. FIG. 15 is a flow chart of an example of the operation of the optimization device according to the present embodiment.

In step S200, the optimization device 220 checks if the calculation is an initial calculation. If the calculation is an initial calculation, the process proceeds to step S202, and the optimization device 220 sets the execution count to "1," initializes necessary variables, and then performs the processing of step S206. If the calculation is not an initial calculation, the optimization device 220 proceeds to step S204, adds "1" to the execution count, and then performs the processing of step S206.

In step S206, to the eccentricity status analysis unit 226, for example, the film formation result of a newly formed film is input as illustrated in FIG. 12. The process proceeds to step S208, and the eccentricity status analysis unit 226 performs, for example, a film thickness variation evaluation for the current Run, from the film formation result of the newly formed film, as illustrated in FIGS. 11A and 11B. The process proceeds to step S210, and to the learning function unit 228, the model stored in the model storage 224 is input.

The process proceeds to step S212, and the learning function unit 228 checks whether there is an error in the model stored in the model storage 224 by using the film formation result and the analysis result input from the eccentricity status analysis unit 226, the teaching position corresponding to the film formation result and the analysis result, and the wafer boat placement position corresponding to the film formation result and the analysis result, and the model input in step S210. If there is an error, the learning function unit 228 corrects the model.

The process proceeds to step S214. When the model corrected by the learning function unit 228 and constraint conditions are input, the optimization function unit 230 creates the following evaluation function J, and performs an optimization calculation for finding a combination that minimizes the evaluation function J.

$$\text{Evaluation function } J = f(\text{residual from Edge average of current RUN, model, movement change amount}) \quad (1)$$

The "residual from the Edge average of the current Run" in the evaluation function J is the residual between the average film thickness and the film thickness of each of the monitoring points MP1 to MP24, for the current Run, as illustrated in FIG. 16. The "model" in the evaluation function J is a model stored in the model storage 224. The "movement change amount" in the evaluation function J represents the movement amount of RT, the movement amount of FB, and the movement amount of the wafer boat, which are to be set for the next Run. FIG. 16 is a view illustrating an example of "the residual from the Edge average of the current Run" in the evaluation function J.

The optimization function unit 230 finds a combination that minimizes the evaluation function J. When the found combination falls within a range satisfying the constraint conditions, the optimization function unit 230 designates the movement change amounts in the combination, in the transfer device 30, as the optimum teaching position in the current wafer boat placement position. The transfer device 30 places the wafer W on the supporting portions 84 of the wafer boat 80 according to the designated teaching position. Meanwhile, when the found combination does not fall within a range satisfying the constraint conditions, the optimization function unit 230 outputs the movement change amounts in the combination, as the optimum wafer boat placement position and the teaching position at the wafer boat placement position.

In this way, by performing the optimization calculation, the optimization function unit 230 calculates the optimum wafer boat placement position that is expected to minimize the effect of eccentricity and the optimum teaching position at the wafer boat placement position. The process proceeds to step S216. The optimization function unit 230 predicts a variation state of film thicknesses in a case where a film is formed by using the calculated optimum wafer boat placement position and the optimum teaching position at the wafer boat placement position.

Figure 18:
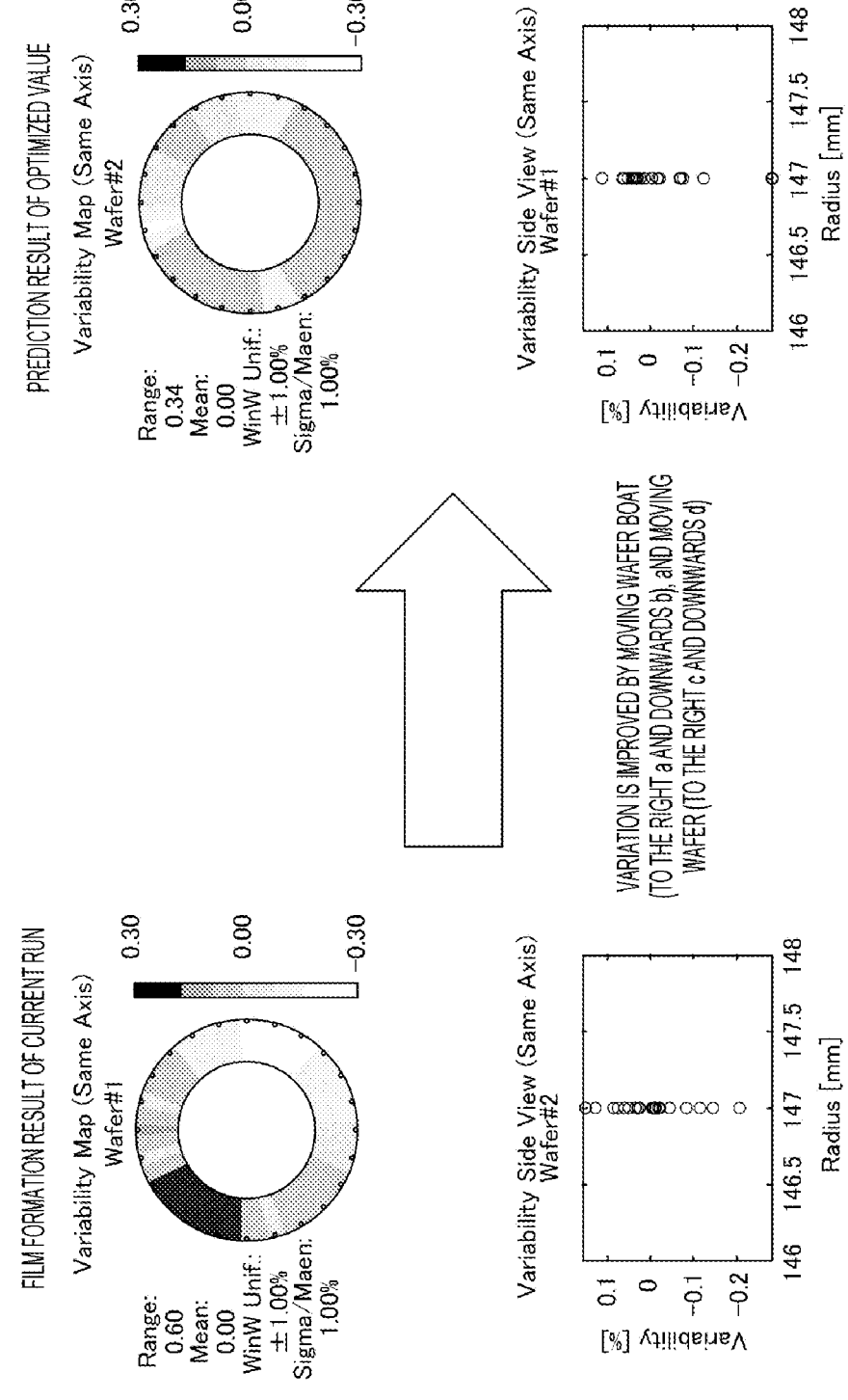
FIG. 18 is a view illustrating a display example of an optimum teaching position, and a prediction result on the film thickness variation state in a case where a film is formed by using the optimum teaching position.

The process proceeds to step S218. The optimization function unit 230 may display or output the optimum wafer boat placement position, the optimum teaching position at the optimum wafer boat placement position, and the prediction result on the film thickness variation state in a case where a film is formed by using the optimum teaching position, in, for example, drawings or tables as illustrated in FIG. 18, or in the data format of a spreadsheet application.

Second Embodiment

Figure 19:
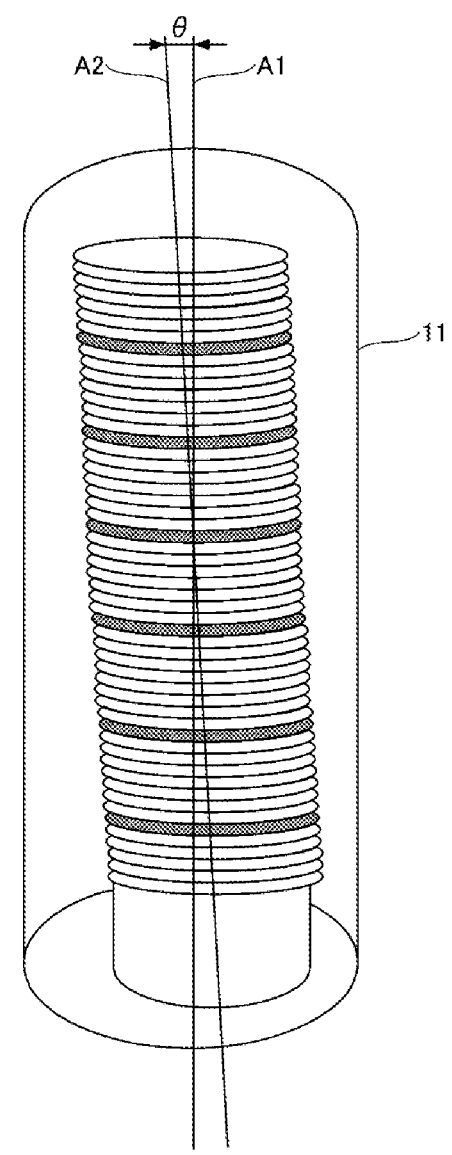
FIG. 19 is a view illustrating an example of a case where a wafer boat is tilted within a reaction chamber.

The wafer boat 80 has a vertically long cylindrical shape, and its height may reach several meters in some cases. Thus, it is difficult to place the wafer boat 80 in such a manner that the rotation axis is completely along the vertical direction. Also, since the wafer boat 80 is heavy, the rotation axis may be distorted to the left or right in some cases. FIG. 19 is a view illustrating an example of a case where the rotation axis of a wafer boat is tilted within a reaction chamber. As illustrated in FIG. 19, the central axis A2 of the wafer boat 80 may deviate from the central axis A1 of the reaction chamber 11 in some cases. Hereinafter, the angle (θ) formed between the central axis A1 of the reaction chamber 11 and the central axis A2 of the wafer boat 80 is also called a wafer boat tilt angle.

If the wafers W transferred into the wafer boat 80 are not horizontally placed because the wafer boat 80 is tilted within the reaction chamber 11, the eccentricity tendency may differ between the wafer W transferred to the top of the wafer boat 80 and the wafer W transferred to the bottom. In such a case, even if the optimized teaching positions are used, the improvement amount differs between the wafer W transferred to the top of the wafer boat 80 and the wafer W transferred to the bottom. If this difference in the improvement amount is large, there is a limit to the improvement amount for the wafer boat 80 as a whole.

The eccentricity elimination program according to the present embodiment optimizes the tilt of the rotation axis of the wafer boat 80 (hereinafter, also referred to as a "wafer boat tilt angle"). The operator may adjust the tilt of the rotation axis of the wafer boat 80 within the reaction chamber 11, in accordance with the output wafer boat tilt angle, so as to improve the eccentricity. If the heat treatment apparatus can automatically adjust the tilt of the rotation axis of the wafer boat 80, the tilt of the rotation axis of the wafer boat 80 within the reaction chamber 11 may be automatically adjusted according to the output wafer boat tilt angle.

[Information Processing System in which Eccentricity Elimination Program is Executed]

The optimization device 220 according to the present embodiment is an information processing device in which the eccentricity elimination program according to the present embodiment is executed. By using the pre-created model to be described below, the input film thickness measurement result, and the input wafer boat tilt angle, the optimization device 220 according to the present embodiment calculates the wafer boat tilt angle that is expected to minimize the effect of eccentricity as described below.

To the operator, the optimization device 220 according to the present embodiment may express, through displaying, the calculated wafer boat tilt angle that is expected to minimize the effect of eccentricity, and the degree of eccentricity improved when a film is formed by using the wafer boat tilt angle.

[Functional Blocks]

Figure 20:
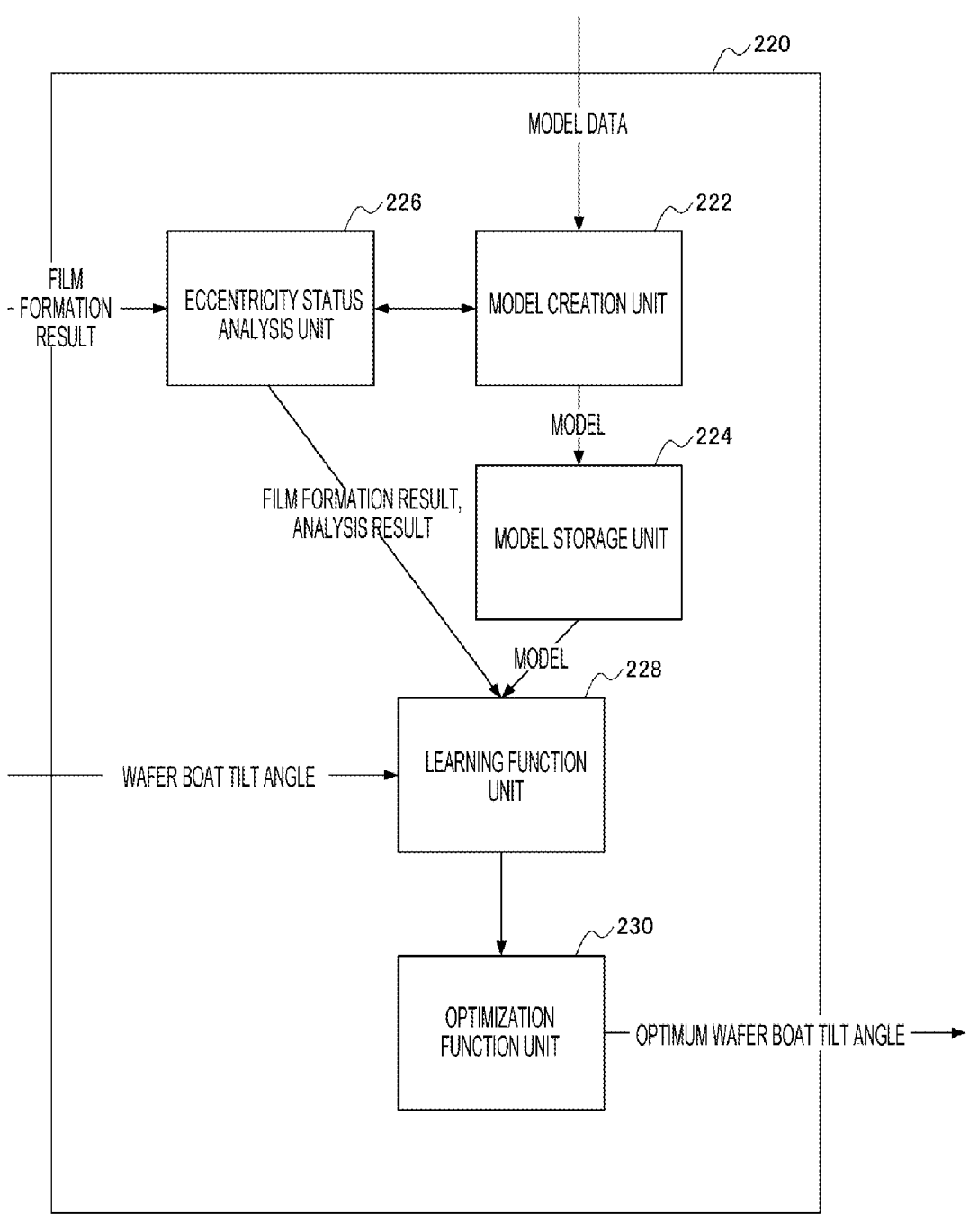
FIG. 20 is a functional block diagram of an example of an optimization device according to a second embodiment.

Next, descriptions will be made on functional blocks of the optimization device 220 according to the present embodiment. FIG. 20 is a functional block diagram of an example of the optimization device according to the present embodiment. The optimization device 220 according to the present embodiment realizes the model creation unit 222, the model storage 224, the eccentricity status analysis unit 226, the learning function unit 228, and the optimization function unit 230 by executing the eccentricity elimination program according to the present embodiment.

To the model creation unit 222 according to the present embodiment, results (results of multiple Runs) obtained by previously performing film formation with a plurality of control knobs can be input as model data. The model data includes the film thicknesses of the monitoring points MP1 to MP24 of the monitor wafer for each Run, and a wafer boat tilt angle. The model creation unit 222 creates a model by using the model data. The created model represents how the eccentric state changes according to the changes in the wafer boat tilt angle, which is expressed as a mathematical formula. The model storage 224 stores the model.

The learning function unit 228 according to the present embodiment receives the film formation result and the analysis result input from the eccentricity status analysis unit 226, the wafer boat tilt angle corresponding to the film formation result and the analysis result (an example of a "substrate holder setting value" in the present embodiment), and the model stored in the model storage 224 so as to perform learning. More specifically, the learning function unit 228 checks whether there is an error in the model stored in the model storage 224 by using the film formation result and the analysis result input from the eccentricity status analysis unit 226, and the wafer boat tilt angle corresponding to the film formation result and the analysis result. If there is an error, the learning function unit 228 corrects the model.

When the model corrected by the learning function unit 228 is input, the optimization function unit 230 according to the present embodiment performs optimization calculations so as to calculate the optimum wafer boat tilt angle that is expected to minimize the effect of eccentricity. The optimization function unit 230 outputs the calculated optimum wafer boat tilt angle.

When outputting the calculated optimum wafer boat tilt angle, the optimization device 220 displays, in a drawing or a table, the degree of eccentricity (amount of improvement) improved when the film is formed using the wafer boat tilt angle. Therefore, after checking the amount of eccentricity improvement, the operator can determine whether to use the current wafer boat tilt angle as it is, or to use the newly calculated optimum wafer boat tilt angle.

[Processing]

Figure 21:
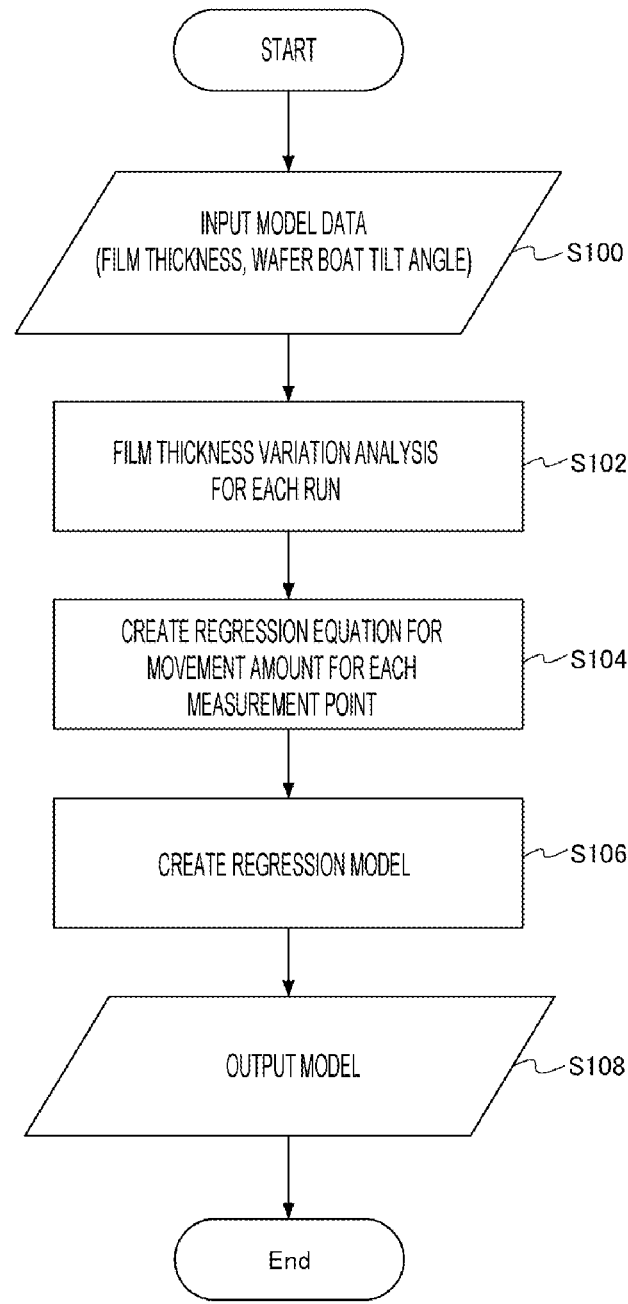
FIG. 21 is a flow chart of an example of model creation processing according to the second embodiment.

FIG. 21 is a flow chart of an example of model creation processing according to the present embodiment. In step S100, to the model creation unit 222, results of multiple Runs can be input as model data. The model data includes the film thicknesses of the monitoring points MP1 to MP24 of the monitor wafer for each Run, and a wafer boat tilt angle.

In step S102, the model creation unit 222 causes the eccentricity status analysis unit 226 to analyze the film thickness variation evaluation for each Run.

In step S104, the model creation unit 222 creates a regression equation of the film thickness variation evaluation value with respect to a movement amount from the base position, for each of measurement points which are monitoring points MP1 to MP24.

In step S106, the model creation unit 222 creates a regression model by using the created regression equation. In step S108, the model creation unit 222 outputs the created model.

<Operation>

Figure 22:
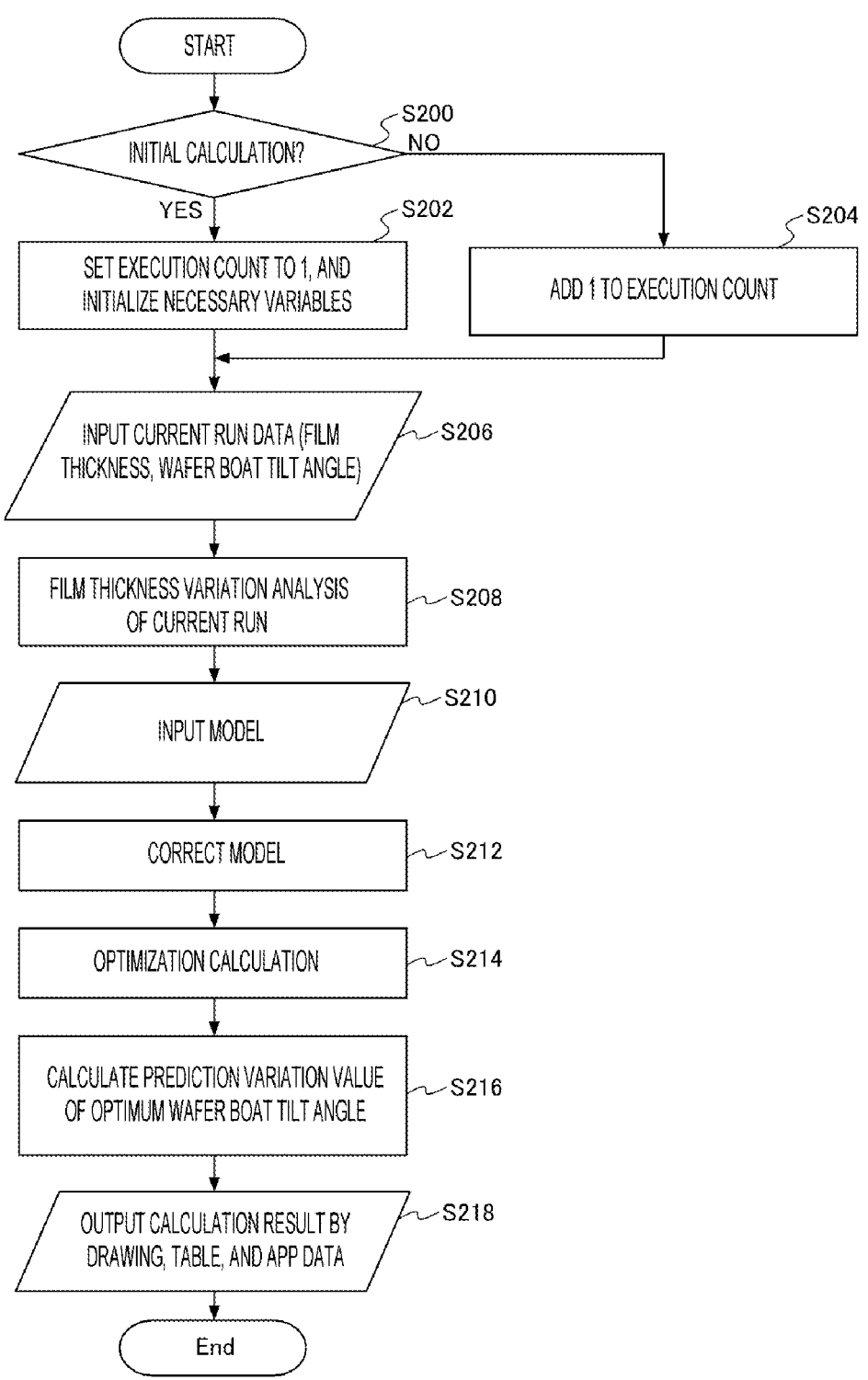
FIG. 22 is a flow chart of an example of the operation of the optimization device according to the second embodiment.

The optimization device 220 according to the present embodiment is operated as in FIG. 22 by using the created model, the film formation result of the newly formed film, and the wafer boat tilt angle. FIG. 22 is a flow chart of an example of the operation of the optimization device 220 according to the present embodiment.

In step S200, the optimization device 220 checks if the calculation is an initial calculation. If the calculation is an initial calculation, the process proceeds to step S202, and the optimization device 220 sets the execution count to "1," initializes necessary variables, and then performs the processing of step S206. If the calculation is not an initial calculation, the optimization device 220 proceeds to step S204, adds "1" to the execution count, and then performs the processing of step S206.

In step S206, to the eccentricity status analysis unit 226, the film formation result of a newly formed film is input. The process proceeds to step S208, and the eccentricity status analysis unit 226 performs a film thickness variation evaluation for the current Run, from the film formation result of the newly formed film. The process proceeds to step S210, and to the learning function unit 228, the model stored in the model storage 224 is input.

The process proceeds to step S212, and the learning function unit 228 checks whether there is an error in the model stored in the model storage 224 by using the film formation result and the analysis result input from the eccentricity status analysis unit 226, and the wafer boat tilt angle corresponding to the film formation result and the analysis result, and the model input in step S210. If there is an error, the learning function unit 228 corrects the model.

The process proceeds to step S214. When the model corrected by the learning function unit 228 and constraint conditions are input, the optimization function unit 230 creates the evaluation function J, and performs an optimization calculation for finding a combination that minimizes the evaluation function J. The "movement change amount" in the evaluation function J according to the present embodiment is the movement amount of the wafer boat tilt angle which is to be set for the next Run. The movement amount of the wafer boat tilt angle includes, for example, the direction and angle in/at which the central axis of the wafer boat is tilted.

The optimization function unit 230 finds a combination that minimizes the evaluation function J. The optimization function unit 230 outputs the movement change amount in the found combination, as the optimum wafer boat tilt angle.

In this way, by performing the optimization calculation, the optimization function unit 230 calculates the optimum wafer boat tilt angle that is expected to minimize the effect of eccentricity. The process proceeds to step S216, the optimization function unit 230 predicts a variation state of film thicknesses in a case where a film is formed by using the calculated optimum wafer boat tilt angle.

The process proceeds to step S218. The optimization function unit 230 may display or output the optimum wafer boat tilt angle, and the prediction result on the film thickness variation state in a case where a film is formed by using the optimum tilt angle, in drawings or tables, or in the data format of a spreadsheet application.

The configuration of the second embodiment may be combined with the configuration of the first embodiment. That is, the model creation unit 222 may create a model by using model data including film thicknesses of monitoring points of a monitor wafer, a teaching position, a wafer boat placement position, and a wafer boat tilt angle. The learning function unit 228 may perform model learning by using the film formation result and the analysis result, the teaching position, the wafer boat placement position, and the wafer boat tilt angle. Further, the optimization function unit 230 may perform optimization calculations so as to calculate an optimum wafer boat placement position and an optimum wafer boat tilt angle, which are expected to minimize the effect of eccentricity, and an optimum teaching position at the wafer boat placement position and the wafer boat tilt angle.

Although so far preferred embodiments of the present disclosure have been described in detail, the present disclosure is not limited to the above-described embodiments. Various modifications and replacements can be made to the above-described embodiments without departing from the scope of the present disclosure. For example, in the present embodiments, the heat treatment apparatus 200 has been described as an example, but an application to batch film forming apparatuses, such as a chemical vapor deposition (CVD) method, a thermal oxidation method, and an atomic layer deposition (ALD) method, is also possible.

The transfer device 30 is an example of a substrate transfer device. The wafer boat 80 is an example of a substrate holder. The heat treatment apparatus 200 is an example of a substrate processing apparatus. The controller 140 is an example of a substrate transfer controller. A wafer boat placement position and a wafer boat tilt angle are examples of a placement condition of a wafer boat.

According to an aspect, the uniformity of the substrate processing result can be enhanced.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
a processing chamber configured to process a plurality of substrates transferred from a storage chamber to a substrate holder by a substrate transfer device including an arm, the substrate holder being introduced into the processing chamber by a substrate holder moving unit including a fork; and
a substrate transfer controller configured to obtain a film thickness measurement result as a processing result of at least one substrate, determine a placement condition of the substrate holder and a substrate placement position on the substrate holder based on a model, a substrate transfer position setting value, and a substrate holder setting value from the film thickness measurement result, and operate the substrate transfer device,
wherein the substrate transfer controller includes:
an eccentricity status analysis circuitry that analyzes an eccentric state from a film thickness variation state when the film thickness measurement result is newly obtained;
a learning function circuitry that updates the model based on the eccentric state analyzed by the eccentricity status analysis circuitry; and
an optimization function circuitry that updates the placement condition of the substrate holder and the substrate placement position on the substrate holder based on the model updated by the learning function circuitry, the substrate transfer position setting value, and the substrate holder setting value.

2. The substrate processing apparatus according to claim 1, wherein the substrate holder setting value includes a placement position of the substrate holder,
the substrate transfer controller determines the placement position of the substrate holder and the substrate placement position on the substrate holder based on the model, the substrate transfer position setting value, the substrate holder setting value, and a constraint condition for the substrate placement position on the substrate holder, and
the optimization function circuitry updates the placement position of the substrate holder and the substrate placement position on the substrate holder based on the model updated by the learning function circuitry, the substrate transfer position setting value, the substrate holder setting value, and the constraint condition.

3. The substrate processing apparatus according to claim 2, wherein the substrate transfer controller operates the substrate transfer device when the determined placement position of the substrate satisfies the constraint condition, and displays the placement position of the substrate holder when the determined placement position of the substrate satisfies the constraint condition.

4. The substrate processing apparatus according to claim 1, wherein the substrate holder setting value includes a tilt angle of the substrate holder,
the substrate transfer controller determines the tilt angle of the substrate holder and the substrate placement position on the substrate holder based on the pre-created model, the substrate transfer position setting value, and the substrate holder setting value, and
the optimization function circuitry updates the tilt angle of the substrate holder and the substrate placement position on the substrate holder based on the model updated by the learning function circuitry, the substrate transfer position setting value, and the substrate holder setting value.

5. The substrate processing apparatus according to claim 4, wherein the substrate transfer controller outputs the tilt angle of the substrate holder when the determined tilt angle of the substrate holder is different from the substrate holder setting value.

6. The substrate processing apparatus according to claim 1, wherein the substrate holder setting value includes a placement position of the substrate holder and an angle of a rotation axis of the substrate holder,
the substrate transfer controller determines the placement position of the substrate holder, a tilt angle of the substrate holder and the substrate placement position on the substrate holder based on the pre-created model, the substrate transfer position setting value, the substrate holder setting value, and a constraint condition for the substrate placement position on the substrate holder, and the optimization function circuitry updates the placement position of the substrate holder, the tilt angle of the substrate holder and the substrate placement position on the substrate holder based on the model updated by the learning function circuitry, the substrate transfer position setting value, the substrate holder setting value, and the constraint condition.

7. The substrate processing apparatus according to claim 6, wherein the substrate transfer controller operates the substrate transfer device when the determined placement position of the substrate satisfies the constraint condition, and displays the placement position of the substrate holder when the determined placement position of the substrate satisfies the constraint condition.

8. The substrate processing apparatus according to claim 6, wherein the substrate transfer controller outputs the tilt angle of the substrate holder when the determined tilt angle of the substrate holder is different from the substrate holder setting value.

9. A substrate processing method comprising:

providing a substrate processing apparatus that transfers a plurality of substrates contained in a storage chamber to a substrate holder by a substrate transfer device including an arm, introduces the substrate holder into a processing chamber by a substrate holder moving unit including a fork, and processes the plurality of substrates;

obtaining a film thickness measurement result as a processing result of at least one substrate, determining a placement condition of the substrate holder and a substrate placement position on the substrate holder based on a model, a substrate transfer position setting value and a substrate holder setting value, from the film thickness measurement result, and operating the substrate transfer device;

analyzing an eccentric state from a film thickness variation state when the film thickness measurement result is newly obtained;

updating the model based on the eccentric state analyzed by the analyzing; and updating the placement condition of the substrate holder and the substrate placement position on the substrate holder based on the model updated by the updating, the substrate transfer position setting value, and the substrate holder setting value.

10. A non-transitory computer-readable storage medium having stored therein a program that causes an information processing apparatus for controlling a substrate processing apparatus that transfers a plurality of substrates contained in a storage chamber to a substrate holder by a substrate transfer device including an arm, introduces the substrate holder into a processing chamber by a substrate holder moving unit including a fork, and processes the plurality of substrates, to execute a process including:

obtaining a film thickness measurement result as a processing result of at least one substrate, determining a placement condition of the substrate holder and a substrate placement position on the substrate holder based on a model, a substrate transfer position setting value and a substrate holder setting value, from the film thickness measurement result, and operating the substrate transfer device;

analyzing an eccentric state from a film thickness variation state when the film thickness measurement result is newly obtained;

updating the model based on the eccentric state analyzed by the analyzing; and updating the placement condition of the substrate holder and the substrate placement position on the substrate holder based on the model updated by the updating, the substrate transfer position setting value, and the substrate holder setting value.

* * * * *